United States Patent
Iwayama et al.

(10) Patent No.: US 9,556,501 B2
(45) Date of Patent: Jan. 31, 2017

(54) MAGNESIUM-BASED COMPOSITE MEMBER, HEAT RADIATION MEMBER, AND SEMICONDUCTOR DEVICE

(75) Inventors: Isao Iwayama, Osaka (JP); Taichiro Nishikawa, Osaka (JP); Yoshiyuki Takaki, Osaka (JP); Toshiya Ikeda, Toyama (JP); Shigeki Koyama, Toyama (JP)

(73) Assignees: Sumitomo Electric Industries, Ltd., Osaka-shi, Osaka (JP); A.L.M.T. Corp, Tokyo (JP)

( * ) Notice: Subject to any disclaimer, the term of this patent is extended or adjusted under 35 U.S.C. 154(b) by 414 days.

(21) Appl. No.: 13/635,988

(22) PCT Filed: Mar. 16, 2011

(86) PCT No.: PCT/JP2011/056260
§ 371 (c)(1),
(2), (4) Date: Sep. 19, 2012

(87) PCT Pub. No.: WO2011/125441
PCT Pub. Date: Oct. 13, 2011

(65) Prior Publication Data
US 2013/0009301 A1    Jan. 10, 2013

(30) Foreign Application Priority Data

Apr. 2, 2010  (JP) .................................. 2010-085639
Apr. 2, 2010  (JP) .................................. 2010-085640

(51) Int. Cl.
*H01L 23/10*  (2006.01)
*C22C 1/10*   (2006.01)
(Continued)

(52) U.S. Cl.
CPC ............... *C22C 1/1068* (2013.01); *B22F 3/11* (2013.01); *C22C 1/1015* (2013.01); *C22C 23/00* (2013.01);
(Continued)

(58) Field of Classification Search
CPC .......... C22C 1/068; C22C 1/065; C22C 1/067; C22C 1/1015; C22C 23/00; C22C 23/02; C22C 47/06; C22C 49/04; C22C 49/14; C22C 47/47; C22C 49/01; H01L 23/3733; H01L 23/3736; H01L 23/4006; H01L 2924/0002; B22F 3/11
(Continued)

(56) References Cited

U.S. PATENT DOCUMENTS

2004/0241447 A1* 12/2004 Fukushima ........... C04B 41/009
                                                            428/408
2007/0132127 A1   6/2007 Fukushima
(Continued)

FOREIGN PATENT DOCUMENTS

CN    101107707 A    1/2008
JP    2002-285258   10/2002
(Continued)

*Primary Examiner* — Vongsavanh Sengdara
(74) *Attorney, Agent, or Firm* — Drinker Biddle & Reath LLP

(57) ABSTRACT

A magnesium-based composite member is provided with a through hole through which a fastening member for attachment to a fixing target is to be inserted. A substrate is provided with a substrate hole through which the fastening member is to be inserted, and made of a composite material which is a composite of SiC and a matrix metal which is any of magnesium and a magnesium alloy. A receiving portion is attached to the substrate and made of a metal material different from the matrix metal. The receiving portion is provided with a receiving portion hole through which the fastening member is to be inserted, and at least a part of an (Continued)

inner circumferential surface of the through hole is formed from an inner circumferential surface of the receiving portion hole.

12 Claims, 12 Drawing Sheets

(51) Int. Cl.
| | |
|---|---|
| C22C 29/06 | (2006.01) |
| H01L 23/373 | (2006.01) |
| H01L 23/40 | (2006.01) |
| B22F 3/11 | (2006.01) |
| C22C 23/00 | (2006.01) |
| C22C 23/02 | (2006.01) |
| C22C 47/06 | (2006.01) |
| C22C 49/04 | (2006.01) |
| C22C 49/14 | (2006.01) |

(52) U.S. Cl.
CPC ............ *C22C 23/02* (2013.01); *C22C 29/065* (2013.01); *C22C 29/067* (2013.01); *C22C 47/06* (2013.01); *C22C 49/04* (2013.01); *C22C 49/14* (2013.01); *H01L 23/3733* (2013.01); *H01L 23/3736* (2013.01); *H01L 23/4006* (2013.01); *H01L 2924/0002* (2013.01); *Y10T 428/12007* (2015.01); *Y10T 428/12361* (2015.01)

(58) Field of Classification Search
USPC ..... 257/706, E23.08; 165/185; 428/185, 596
See application file for complete search history.

(56) References Cited

U.S. PATENT DOCUMENTS

| | | |
|---|---|---|
| 2008/0038535 A1 | 2/2008 | Fukushima |
| 2008/0122052 A1* | 5/2008 | Fukui .................. B22F 7/04 257/678 |
| 2011/0256419 A1 | 10/2011 | Iwayama et al. |

FOREIGN PATENT DOCUMENTS

| | | |
|---|---|---|
| JP | 2005-2470 | 1/2005 |
| JP | 2006-299304 | 11/2006 |
| JP | 2007-247058 | 9/2007 |
| JP | 4594433 | 12/2010 |

* cited by examiner

MAGNESIUM-BASED COMPOSITE MEMBER, HEAT RADIATION MEMBER, AND SEMICONDUCTOR DEVICE

TECHNICAL FIELD

The present invention relates to a composite member made of a composite of magnesium (what is called pure magnesium) or a magnesium alloy and a non-metal inorganic material such as SiC, a heat radiation member formed from this composite member, and a semiconductor device including this heat radiation member. In particular, the present invention relates to a composite member capable of maintaining a state of secure fixing to a fixing target.

BACKGROUND ART

Not only a constituent material composed only of a metal material such as copper but also a composite material made of a metal and a non-metal inorganic material (representatively, ceramics), such as Al-SiC, have been made use of as a constituent material for a heat radiation member (a heat spreader) to be attached to a semiconductor element. Mainly aiming to achieve lighter weight of a heat radiation member, a magnesium-based composite material including magnesium (Mg) which is lighter in weight than aluminum (Al) or an alloy thereof as a base material has recently been studied (see Japanese Patent Laying-Open No. 2006-299304 (PTL 1) and Japanese Patent No. 4594433 (PTL 2)).

CITATION LIST

Patent Literature

PTL 1: Japanese Patent Laying-Open No. 2006-299304
PTL 2: Japanese Patent No. 4594433

SUMMARY OF INVENTION

Technical Problem

A heat radiation member to which a semiconductor element has been attached is used as fixed to such a fixing target as a cooler. For fixing this heat radiation member, representatively, such a fastening member as a bolt is made use of. In this case, the heat radiation member should have a through hole through which the fastening member is inserted. A heat radiation member including such a through hole and formed of the magnesium-based composite material is desired to have higher reliability of a state of fixing by the fastening member.

In a case where the through hole is provided in the magnesium-based composite material described above and such a fastening member as a bolt is fastened, Mg or an Mg alloy forming a portion in the vicinity of the through hole can sufficiently receive axial force of the fastening member because it is highly strengthened by SiC. Therefore, Mg or the Mg alloy forming the portion in the vicinity of the through hole is less likely to experience lowering in axial force due to creep strain accompanying a heat cycle as will be described later.

Meanwhile, SiC is generally a brittle material and poor in toughness. Therefore, depending on a form of presence of SiC, at the time when such a fastening member as a bolt is fastened, a portion in the vicinity of the through hole, in particular, SiC, cannot withstand force applied by axial force of the fastening member, it becomes an origin of a fracture, and a brittle fracture may occur. Here, increase in content of SiC in the composite material or use of an SiC porous body in which SiC is bonded to one another through heat treatment as a source material can improve thermal conductivity of the composite material or lower a coefficient of thermal expansion thereof. In particular, use of an SiC porous body in which a content of SiC is high (preferably higher than 70 volume %) and SiC is bonded to one another will lead to thermal characteristics superior to those of a form in which SiC is present in a dispersed manner. For example, use of the SiC porous body can bring about extremely high thermal characteristics as a constituent material for a heat radiation member of a semiconductor device, such as thermal conductivity not lower than 180 W/m·K and a coefficient of thermal expansion approximately from 4 ppm/K to 8 ppm/K. In a case where SiC is bonded to one another and SiC is continuously present in the composite material as described above, however, when a small crack is generated in a part of SiC at the time of fastening of the fastening member, a fracture develops with this crack serving as the origin and a portion forming the vicinity of the through hole may fracture. If such a fracture occurs, it is difficult to securely fix the heat radiation member formed of the composite material to a fixing target.

On the other hand, it is possible to provide a metal region composed substantially only of Mg or an Mg alloy in a part of the composite material and to provide a through hole in this metal region. Mg or the Mg alloy, however, tends to be lower in strength at a high temperature (for example, creep strength) than Al or an alloy thereof. Therefore, if this composite material is made use of for the heat radiation member and subjected to a heat cycle, Mg or the Mg alloy forming a portion in the vicinity of a through hole may experience creep strain or the like, which may result in lowering in axial force of the fastening member and tendency of loosening of a fixed state. Therefore, with such a heat radiation member, it seems to be difficult to maintain a state of secure fixing to a fixing target for a long period.

Then, in view of the problems above, one object of the present invention is to provide a composite member capable of maintaining a state of secure fixing to a fixing target. In addition, another object of the present invention is to provide a heat radiation member formed from the composite member and a semiconductor device including this heat radiation member.

On the other hand, for example, in a case where a through hole is provided in a composite region of SiC and Mg or an Mg alloy, drilling is very difficult because SiC is generally higher in hardness than a metal and therefore such a working method as electric discharge machining is made use of. Then, in consideration of workability in drilling, the present inventors studied fabrication of a composite member including a metal region composed of Mg or an Mg alloy representing a matrix metal as a magnesium-based composite member and provision of a through hole in this metal region.

Mg or the Mg alloy, however, tends to be lower in strength at a high temperature (for example, creep strength) than Al or an alloy thereof. Therefore, if a composite material provided with a through hole in the metal region is made use of for the heat radiation member and subjected to a heat cycle, Mg or the Mg alloy forming a portion in the vicinity of a through hole may experience creep strain or the like, which may result in lowering in axial force of the fastening member and tendency of loosening of a fixed state. Therefore, with such a heat radiation member, it seems to be difficult to maintain a state of secure fixing to a fixing target for a long period.

Then, in view of the problems above, another object of the present invention is to provide a composite member capable of maintaining a state of secure fixing to a fixing target. In addition, another object of the present invention is to provide a heat radiation member formed from the composite member and a semiconductor device including this heat radiation member.

Solution to Problem

In one aspect of the present invention, the object above is achieved by devising a constituent material for a through hole. Specifically, the present invention relates to a magnesium-based composite member made of a composite of SiC and magnesium or a magnesium alloy, and this composite member has a through hole through which a fastening member for attaching the composite member to a fixing target is to be inserted. A material for at least a part forming the through hole is different from SiC and magnesium or the magnesium alloy forming the composite member.

According to the construction above, in a case where a through hole is provided in a composite region of SiC and Mg or the Mg alloy representing a matrix metal, that is, a region where SiC is present, when a fastening member is fastened, a portion of the through hole composed of the aforementioned particular material receives fastening force. Therefore, according to the construction above, in such a form that SiC is present in a dispersed manner, lowering in axial force of the fastening member can effectively be reduced, and in such a form that SiC is bonded to one another, occurrence of a fracture in the vicinity of the through hole as a result of fastening force particularly applied to SiC can effectively be prevented. In addition, according to the construction above, a metal region composed of Mg or the Mg alloy is provided, and in a case where a through hole is provided in this metal region, strength at a high temperature can be improved by including a portion of the through hole composed of the aforementioned particular material. Thus, according to the construction above, in spite of a heat cycle performed, loosening of a fixed state due to lowering in axial force of the fastening member is less likely. Therefore, according to the construction above, the heat radiation member according to the present invention formed from the composite member can securely be fixed to a fixing target and this fixed state can be maintained for a long period in a stable manner. Thus, the heat radiation member according to the present invention can sufficiently dissipate heat from a semiconductor element or the like and it is excellent in heat radiation property. In addition, a semiconductor device according to the present invention including such a heat radiation member and a semiconductor element mounted on this heat radiation member is excellent in heat radiation property.

Various materials excellent in toughness and strength at a high temperature can be made use of as a material for forming at least a part of the through hole. For example, a metal (except for a matrix metal) can suitably be made use of, because it is generally better in toughness than such ceramics as SiC. In addition, organic materials including a resin excellent in heat resistance including fluoroplastic such as PTFE (polytetrafluoroethylene having an upper temperature limit of 260° C.) can also be made use of.

As one form in one aspect of the present invention, a form having a network portion for bonding SiC to one another in the composite member is exemplified.

According to the form above, a content of SiC can readily be increased and it can be, for example, 50 volume % or higher and can further be more than 70 volume %, so that a composite member low in coefficient of thermal expansion can be obtained. In addition, according to the form above, since a continuous path for heat conduction is formed by SiC and a matrix metal, a composite member excellent in heat conduction property can be obtained. Therefore, according to the form above, a composite member suitable for a heat radiation member of a semiconductor element can be obtained.

A constituent material for a network portion is representatively exemplified by SiC. In order to obtain a composite member having a network portion, for example, use as a source material of an SiC aggregate (representatively, an SiC porous body) having a network portion is exemplified. The SiC aggregate can be formed, for example, by forming a powder molded body with any one of tapping, slip casting (molding slurry including source material powders, water, and a dispersant, and then drying the slurry), pressure forming (dry pressing, wet pressing, single-shaft pressure forming, CIP (cold isostatic press), extrusion, and the like), and a doctor blade method (pouring slurry including source material powders, a solvent, an antifoaming agent, a resin, and the like into a doctor blade, and thereafter evaporating the solvent) and then subjecting this molded body to heat treatment.

A vacuum atmosphere, a heating temperature not lower than 1300° C. and not higher than 2500° C., and a holding time from 2 hours to 100 hours are exemplified as heat treatment conditions. By performing sintering under these conditions, SiC can directly be bonded to one another, a network portion can thus be formed of SiC, and further an SiC porous body excellent in strength is obtained. In particular, when a heating temperature is set to 2000° C. or higher, a network portion can have a greater thickness. When the heating temperature is lower than 2000° C., a network portion tends to be thinner. The heating temperature or the holding time should be selected as appropriate in accordance with a form of the network portion.

In a case of providing a network portion, a form of providing a through hole in a region of the composite member where the network portion is present is exemplified. In this case, at least a portion of the through hole with which a head portion of the fastening member is in contact is preferably composed of a metal other than magnesium and the magnesium alloy.

According to the form above, a portion with which the head portion of such a fastening member as a bolt is in contact, that is, a portion on which axial force from the fastening member tends to act, is composed of a metal different in type from the matrix metal (Mg or the Mg alloy) for the composite member. By particularly selecting as this metal, a metal higher in toughness than the matrix metal or a metal excellent in strength at a high temperature, that metal portion receives fastening force when the fastening member is fastened and hence force applied to an SiC portion is mitigated. Here, in a form where SiC particles are present in a dispersed manner, at the time of fastening, particles can move to some extent and hence a fracture is less likely. In a form of providing a network portion, however, a fracture may occur with the SiC portion serving as the origin as described above. Therefore, in the form of providing a network portion, a portion on which axial force from the fastening member tends to act as described above is composed of a metal different in type from the matrix metal, so that such effects as (1) a fracture or the like originating from SiC being less likely and (2) the composite member readily following deformation of the fastening member due to thermal expansion as a result of being subjected to a heat cycle and lowering in axial force of the fastening member and occurrence of creep being suppressed can be achieved, and reliability of a state of fixing to a fixing target can be enhanced. As such a metal having high strength and high toughness, in particular, a metal other than Mg or Mg alloy, such as one type of metal selected from Fe, Ti, Mo, W, Nb, and Ta or an alloy mainly composed of that metal (for example, stainless steel or the like), is suitable. A metal material is preferred because it is excellent in property of intimate contact with the matrix metal.

As one form in one aspect of the present invention, such a form that at least a portion of the through hole with which the head portion of the fastening member is in contact has a metal plate composed of a metal other than magnesium and the magnesium alloy and the metal plate has an area sufficient to project from a periphery of the head portion when the fastening member is fastened and the head portion is in contact with the metal plate is exemplified.

According to the form above, since a portion on which axial force from the fastening member tends to act as described above is composed of a metal other than the matrix metal, such effects that (1) in particular in the form of providing a network portion described above, a fracture or the like originating from SiC when the fastening member is fastened can be suppressed and (2) regardless of a form of presence of SIC, occurrence of creep is suppressed and lowering in axial force is suppressed in spite of a heat cycle performed can be achieved. In particular, in this form, by forming the portion with which the head portion is in contact from the metal plate having such an area as sufficiently projecting from the head portion of the fastening member in a state that the fastening member is fastened, the metal plate can sufficiently receive axial force of the fastening member. Therefore, in this form, since local application of axial force of the fastening member to the vicinity of the through hole can be suppressed and axial force can be distributed, such effects as (1) and (2) above can more reliably be achieved.

A metal such as Fe or an alloy thereof described above is suitable as a constituent metal for the metal plate. In addition, as an area of the metal plate is greater, the metal plate can sufficiently receive axial force of the fastening member. Specifically, an area of the metal plate (an annular area except for the through hole) is preferably greater than an area of the head portion of the fastening member in a plan view, and preferably greater than the area of the head portion by 10% or more, further 15% or more, and among others 20% or more. In addition, in making use of the composite member as the heat radiation member of a semiconductor element or the like, selection is preferably made as appropriate within the scope not causing decrease in area for carrying such parts as a semiconductor element. A thickness, a shape, and an area of the metal plate can be selected as appropriate.

The metal plate can be in a form detachable from the composite member. In this case, a size of a hole provided in the composite member and a size of a hole provided in the metal plate can readily be varied. In this form, the metal plate can include plate-shaped hardware having an inner hole represented by such a washer as a plain washer, a square washer, and a spring washer, in particular hardware slightly larger than hardware in conformity with standards for fastening members or a large-sized plain washer or the like defined under JIS B 1256 (2008) within the scope not causing decrease in area for carrying.

Alternatively, the metal plate can be in such a form as integrated with the composite member. In this case, for example, such a form that a substrate made of a composite material which is a composite of SiC and magnesium or the magnesium alloy and a metal coating layer covering at least one surface of the substrate are included, a periphery of the metal plate is joined to the metal coating layer, and one surface of the metal plate is exposed at the metal coating layer is exemplified as the composite member.

According to the form above, the metal plate is also arranged as appropriate in a cast for making a composite of an SiC aggregate and a matrix metal melt, making of the composite and integration of the metal plate are simultaneously carried out, and a metal plate portion joined in the obtained composite member is drilled, so that the composite member in which a part of the through hole is formed from the metal plate can readily be manufactured and excellent manufacturability is achieved. Furthermore, according to the form above, in an operation for attachment to a fixing target, it is not necessary to separately arrange the metal plate, and in addition the metal plate does not move at the time of fastening of the fastening member and operability in fixing is good. Moreover, according to the form above, as the metal coating layer is provided, conduction can be achieved by making use of the metal coating layer. Therefore, in a case of solder joint in making use of this composite member as a heat radiation member, in providing Ni plating or the like in order to enhance solderability, electroplating can be made use of and plating can readily be formed. Additionally, according to the form above, as the metal coating layer is provided, such effects as (1) good appearance and (2) improvement in corrosion resistance can also be expected. Furthermore, if an outer shape of the metal plate is, for example, irregular and the plate is oddly shaped in this form, an area of contact with the metal coating layer is increased as a result of a longer length of a periphery of the metal plate and hence a property of intimate contact with the metal plate and the constituent metal for the metal coating layer is enhanced. It is noted that, in the form of the above-described metal plate being detachable as well, a form including the metal coating layer is applicable.

The constituent metal for the metal coating layer may be identical to or different from the matrix metal in composition. In a case of the same composition, when the metal coating layer is formed simultaneously with making of a composite of an SiC aggregate and a matrix metal melt, a composite member having a metal coating layer can be manufactured with good productivity. In this case, in the obtained composite member, the matrix metal in the substrate made of the composite material described above and the metal forming the metal coating layer have a continuous texture (cast texture).

A composite member in which the matrix metal and the metal coating layer are identical in composition to each other can readily be manufactured, for example, by making use of an SiC porous body having a network portion described above as a source material. The SiC aggregate fabricated by subjecting such a powder molded body as an SiC porous body to heat treatment has strength to such an extent that it is free-standing in a cast and it can retain a shape by itself. Therefore, the metal coating layer can be formed by arranging such an SiC aggregate as the SiC porous body in a cast, maintaining such a state that a prescribed gap is provided between the cast and the SiC aggregate, and pouring the matrix metal melt in this gap. In addition, in order to provide a metal plate forming a part of the through hole at a prescribed position of the composite member, the metal plate is arranged in the gap between the cast and the SiC aggregate. By doing so, enveloped casting of the metal plate can be achieved simultaneously with formation of the metal coating layer and the composite member in which the metal plate is integrated can readily be manufactured.

In integrating the metal plate simultaneously with formation of the metal coating layer, the metal plate may be different in thickness from the metal coating layer. When a thickness is equal, however, the metal plate can be made use of as a spacer for keeping an interval between the cast and the SiC aggregate described above. In order to reliably maintain the gap, a spacer can separately be made use of. As this spacer, a spacer removable through sublimation as a result of heat generated during making of a composite, such as naphthalene, or a spacer excellent in heat resistance, such as carbon, iron, and stainless steel (for example, SUS430), can be made use of. This spacer may remain buried in the metal coating layer, or a spacer portion may be removed by cutting or the like. For example, when a linear body having a diameter slightly smaller than a metal coating layer to be formed is prepared as a spacer and an SiC aggregate is fixed to a cast by using this linear body to thereby provide a gap in accordance with a diameter of the linear body between the SiC aggregate and the cast, most part of the linear body is buried in the metal coating layer. Thus, even when the linear body is allowed to remain, a composite member having good appearance is obtained.

In a case where the matrix metal for the substrate made of the composite material described above is different in composition from the constituent metal for the metal coating layer, for example, the constituent metal for the metal coating layer is exemplified by an Mg alloy different in composition from the matrix metal and a metal other than Mg and the Mg alloy such as one type of metal selected from the group consisting of Al, Cu, Ni of which purity is not lower than 99% and an alloy mainly composed of Al, Cu, Ni (an alloy containing more than 50 mass % of Al, Cu, Ni).

A composite member in which the matrix metal and the metal coating layer are different in composition from each other can be manufactured, for example, by preparing as appropriate a metal plate for forming a metal coating layer (hereinafter referred to as a coated plate) and making use of at least one technique of brazing, ultrasonic bonding, enveloped casting, rolling (clad rolling), hot pressing, oxide soldering, and joint with an inorganic adhesive. Each technique can be made use of also in a case of manufacturing a composite member in which the matrix metal and the metal coating layer are identical in composition to each other. In a case of making use of a coated plate, by joining a metal plate forming a part of a through hole at an appropriate portion in advance by press-fitting or the like, a metal coating layer including a metal plate can readily be formed.

A region where the metal coating layer is formed and a thickness thereof can be selected as appropriate. For example, at least a surface requiring plating out of surfaces forming a substrate made of the composite material described above, specifically, at least one of a mount surface on which a semiconductor element is to be mounted and a cooled surface opposed to this mount surface and being in contact with a cooling device, is exemplified. In addition, a metal coating layer is preferably present in the vicinity of a region where a through hole is formed, such that at least a part of a periphery of the metal plate forming a part of the through hole described above is joined to the metal coating layer.

A thickness of each metal coating layer may be different from a thickness of the metal plate as described above, so long as at least a part of the periphery of the metal plate forming a part of the through hole described above is joined through the metal coating layer. Too large a thickness of each metal coating layer, however, leads to increase in coefficient of thermal expansion of the composite member or lowering in thermal conductivity of the composite member. Therefore, a thickness not greater than 2.5 mm, particularly not greater than 1 mm, and further not greater than 0.5 mm is preferred. A thickness not smaller than 1 um, particularly not smaller than 0.05 mm (50 μm) and not greater than 0.1 mm (100 μm), sufficiently achieves a function as a base for plating, and in addition breakage of the metal coating layer during transportation, mount or the like of the composite member would be less likely. The metal coating layer may be formed to a large thickness and a desired thickness may be set by polishing or the like. In this case, a thickness of the metal coating layer for joining the periphery of the metal plate forming a part of the through hole can readily be varied.

As a form of including the metal plate, a form in which an inner circumferential surface of the through hole is formed of a metal of the same type as the metal plate is exemplified.

According to the form above, substantially the entire through hole is composed of a metal other than the matrix metal. In particular, by making use of a metal having high strength and high toughness such as Fe or an alloy thereof described above as this metal, a constituent metal for the through hole receives substantially 100% of axial force of the fastening member, and hence occurrence of a fracture or the like, lowering in axial force of the fastening member, or occurrence of creep can be suppressed. This form can be formed in a simplified manner, for example, by forming a composite member, thereafter forming a through hole in the composite member, and press-fitting such hardware having an inner hole as a clinching fastener in this through hole. In a case of making use of such hardware, by employing a form including the metal coating layer described above, the hardware can reliably be fixed to the composite member, which is preferred.

For example, also by providing a through hole in an SiC porous body, fitting a metal mass composed of a metal different from the matrix metal in this through hole, carrying out enveloped casting of the metal mass simultaneously with making of a composite of the SiC porous body and the matrix metal, and providing a through hole in the metal mass, or by carrying out enveloped casting of a cylindrical metal mass, a composite member including a through hole composed of a metal different from the matrix metal in its entirety in the composite region of the matrix metal and SiC is obtained. In a case where a hole provided in advance in the cylindrical metal mass is made use of as a through hole, a step of forming a through hole by machining is not necessary. In addition, also by arranging a metal mass in a cast, thereafter filling the cast as appropriate with SiC powders so as to make a composite of the matrix metal and SiC, simultaneously carrying out enveloped casting of the metal mass, and providing a through hole in the metal mass as described above, a composite member including a through hole composed of a metal different from the matrix metal in the composite region is obtained.

As one form of the present invention, a form in which a coefficient of thermal expansion of the composite member is not lower than 4 ppm/K and not higher than 8 ppm/K and thermal conductivity of the composite member is not lower than 180 W/m·K is exemplified.

By increasing a filling rate of SiC or providing a network portion as described above, a composite member having high thermal conductivity κ and low coefficient of thermal expansion α can be obtained. Although depending on a content of SiC, a form of a network portion, composition of a matrix metal, or the like, a composite member having thermal conductivity κ not lower than 200 W/m·K, particularly not lower than 250 W/m·K, and further not lower than 300 W/m·K can be obtained. It is noted that, in a case where the composite member is made use of as the heat radiation member of a semiconductor element or the like, a coefficient of thermal expansion or thermal conductivity is measured in a portion except for a portion where a semiconductor element or the like is not arranged, that is, a portion of the metal plate or the like described above where a through hole is formed. A coefficient of thermal expansion of the composite member including the form including the metal coating layer can easily be found by fabricating a test piece from the composite member and conducting measurement using a commercially available apparatus. Alternatively, a coefficient of thermal expansion of the composite member including the metal coating layer may be calculated based on mixture rules in consideration of rigidity or the like of each material forming the composite member.

In another aspect, the present invention achieves the object by devising a constituent material for a through hole in a form of including a through hole in the metal region described above. Specifically, the present invention relates to a magnesium-based composite member made of a composite of SiC and magnesium or a magnesium alloy, and this composite member has a metal region not containing SiC but composed of magnesium or the magnesium alloy, and has a through hole through which a fastening member for attachment of the composite member to a fixing target is to be inserted in this metal region. Then, a material for at least a part forming the through hole is different from the constituent metal for the metal region.

According to the construction above, a through hole is provided in a metal region composed of Mg or the Mg alloy and the through hole includes a portion formed of the aforementioned particular material, so that strength at a high temperature can be improved. Therefore, according to the construction above, even though a heat cycle is carried out, loosening of a fixed state due to lowering in axial force of the fastening member is less likely and such a state that the heat radiation member according to the present invention formed from the composite member is securely fixed to a fixing target can be maintained in a stable manner. Thus, the heat radiation member according to the present invention can sufficiently dissipate heat from a semiconductor element or the like and it is excellent in heat radiation property. In addition, a semiconductor device according to the present invention including such a heat radiation member and a semiconductor element mounted on this heat radiation member is excellent in heat radiation property.

Various materials excellent in strength at a high temperature can be made use of as a material for forming at least a part of the through hole, in particular such that loosening of a fixed state due to lowering in axial force of the fastening member is less likely to occur even though a heat cycle is carried out. For example, a metal (other than a matrix metal forming a metal region) is exemplified. In addition, organic materials including a resin excellent in heat resistance including fluoroplastic such as PTFE (polytetrafluoroethylene having an upper temperature limit of 260° C.) can also be made use of.

As one form in another aspect of the present invention, such a form that an embedded member made of a material different from a constituent material for the metal region is provided in at least a part of the metal region in a direction of thickness and at least a part of the through hole is provided in the embedded member is exemplified.

According to the form above, at least a part of the through hole on which axial force from the fastening member acts is formed of a material other than a constituent metal for the metal region, that is, the matrix metal (Mg or the Mg alloy) for the composite member. In particular, by selecting a material superior in strength at a high temperature to the matrix metal as this material, occurrence of creep or lowering in axial force of the fastening member can be suppressed in spite of a heat cycle performed. In addition, as the embedded member forming at least a part of the through hole has its outer surface covered with the metal region, a property of intimate contact thereof with the metal region is excellent. Therefore, this through hole can sufficiently receive axial force and relaxing of axial force can be suppressed.

Various materials can be selected as a constituent material for the embedded member, however, in particular, a material superior in strength at a high temperature to a constituent metal for the metal region is preferred. As such a high-strength material, in particular, a metal material including a metal other than Mg and the Mg alloy such as one type of metal selected from Fe, Ti, Mo, W, Nb, and Ta or an alloy mainly composed of that metal (such as stainless steel) and a non-metal material such as a material containing carbon or carbon fibers are exemplified. The metal material is preferred because it is excellent in property of intimate contact with the metal region. In a case where the embedded member is composed of a metal, use of an embedded member provided, for example, with an insulating layer such as an oxide film on a surface of the embedded member can reduce cell corrosion due to contact between different types of metals of the matrix metal forming the metal region and a metal forming the embedded member. For example, in a case where an oxide film composed of a material not reacting to Mg, such as CaO, is made use of for the oxide film, the oxide film remains as it is after a composite is made and it functions as an insulating layer. On the other hand, for example, in a case where an oxide film composed of a material reacting to Mg, such as $SiO_2$ or an organic oxide, is made use of for the oxide film, MgO is generated at the time of making of a composite and this reaction product MgO functions as an insulating layer.

It is noted that a portion composed of a material different from the matrix metal forming the metal region and forming at least a part of the through hole can be in a form detachable from the metal region. By providing an embedded member as described above, however, it is less likely to fall off from the metal region, and in addition, in attachment to a fixing target, it is not necessary to arrange a separate member for receiving axial force of the fastening member and thus operability in fixing is excellent.

As one form in another aspect of the present invention, at least a portion of the through hole with which a head portion of the fastening member is in contact is preferably composed of a metal different form a constituent metal for the metal region.

According to the form above, a portion with which the head portion of such a fastening member as a bolt is in contact, that is, a portion on which axial force from the fastening member tends to act, is composed of a metal different in type from the constituent metal (matrix metal) for the metal region. By particularly selecting as this metal, a metal superior in strength at a high temperature to the matrix metal (representatively, a metal material such as Fe described above), the composite member is likely to follow deformation of the fastening member due to thermal expansion as a result of being subjected to a heat cycle, lowering in axial force of the fastening member and occurrence of creep can be suppressed, and reliability of a state of fixing to a fixing target can be enhanced. In this form, for example, a part of the embedded member described above is exposed at the surface of the metal region, so that this exposed region serves as a portion with which the head portion is in contact.

As one form in another aspect of the present invention, such a form that the embedded member has a metal plate, or such a form that an embedded member is present over the entire length of the metal region in a direction of thickness, or such a form that at least a part of the embedded member contains metal fibers is exemplified.

A form of the embedded member can be selected as appropriate, and for example, a form including a metal plate, a metal mass such as a columnar body or a cylindrical body, an object having a complicated three-dimensional shape based on combination of the metal plate and the metal mass (for example, hardware having an inner hole such as a clinching fastener), or metal fibers composed of a metal different from a constituent metal for the metal region, and a form including the metal plate or both of the metal mass and the metal fibers, are exemplified. As a constituent material for these embedded members, such a metal material as Fe excellent in strength at a high temperature described above can suitably be made use of.

As a form including the metal plate, in particular a form including only a metal plate can reduce a content of a metal other than a matrix metal, and a light-weight composite member can be obtained. In addition, in the form including the metal plate, such a form that one surface of the metal plate is exposed at the surface of the metal region and this exposed surface serves as a portion with which a head portion of the fastening member described above is in contact is adopted, so that the metal plate can sufficiently receive axial force of the fastening member, which is preferred. In particular, by setting an exposed area to such a size that the metal plate projects from a periphery of this head portion in a state that the fastening member is fastened and the head portion of this fastening member is in contact with the exposed region, axial force of the fastening member can sufficiently be received, local application of axial force of the fastening member onto the vicinity of the through hole is suppressed, and axial force can be distributed. As the exposed area is greater, axial force of the fastening member can sufficiently be received, however, in making use of the composite member as a heat radiation member of a semiconductor element or the like, an area is preferably selected as appropriate within the scope not causing decrease in area for carrying such parts as a semiconductor element. For example, such a form that the exposed area in the metal plate (an annular area except for the through hole) can be greater than an area of the head portion of the fastening member in a plan view can be adopted. The exposed area greater than the area of the head portion by 10% or more, further 15% or more, and among others 20% or more, can bring about effective suppression of local application of axial force of the fastening member onto the vicinity of the through hole as described above. Alternatively, in a case where a metal plate is formed of a high-hardness material such as iron or an alloy thereof, it is expected that a thickness large to some extent can effectively suppress local application of axial force of the fastening member onto the vicinity of the through hole as described above even though the form is such that the exposed area is smaller than the area of the head portion. A thickness and a shape of the metal plate can be selected as appropriate.

In the form including the metal mass, a region receiving axial force of the fastening member can readily be made larger and axial force applied to the metal region can be reduced. For example, the embedded member can be in such a form that it is present only in a part of the metal region in a direction of thickness and at least one opening portion of the through hole is composed of a constituent metal for the metal region, that is, in such a form that the through hole is composed of a constituent material for the embedded member and a constituent material for the metal region. In this form, the embedded member present in a part of the metal region can reduce axial force applied to the metal region, and in addition a surface of a portion where this embedded member is present is formed of a constituent metal for the metal region, so that good appearance is obtained, such working as plating or polishing is readily performed, or a surface of the composite member can be composed substantially only of a metal in a case of a form including a metal coating layer which will be described later. Alternatively, the form may be such that the embedded member is present over the entire length of the metal region in a direction of thickness, that is, such that opposing end surfaces of the embedded member are exposed at the surface of the metal region and the through hole is composed of a constituent material for the embedded member. In this form, the embedded member receives substantially 100% of axial force of the fastening member, and lowering in axial force of the fastening member and occurrence of creep can effectively be suppressed. A size and a shape of the metal mass can be selected as appropriate. For example, by employing such an oddly shaped columnar body that an outer shape of a metal mass is irregular, an area of contact between the metal mass and the metal region is increased, and in addition the metal mass and the metal region are three-dimensionally engaged with each other. Thus, since capability of holding the metal mass in the metal region is enhanced, a property of intimate contact between the metal mass and the matrix metal forming the metal region can be improved.

In the form including the metal fibers, mechanical characteristics of the embedded member can readily be varied depending on a degree of filling with the metal fibers. A low rate of filling with the metal fibers can contribute to lighter weight as described above, and a high filling rate and a great filling region, in particular, presence of metal fibers over the entire length of the metal region in a direction of thickness, can effectively contribute to lowering in axial force applied to the metal region as described above. In this form, a constituent metal for the metal region impregnates in between the metal fibers, so that a property of intimate contact between the embedded member made of the metal fibers and the constituent metal for the metal region is excellent. In addition, the metal fibers readily form a desired shape and they are easily made use of.

A magnesium-based composite member in yet another aspect of the present invention is provided with a through hole through which a fastening member for attachment to a fixing target is to be inserted, and it has a substrate and a receiving portion. The substrate is composed of a composite material which is a composite of a matrix metal which is any of magnesium and a magnesium alloy and SiC as SiC particles dispersed in the matrix metal, and is provided with a penetrating portion. The receiving portion is attached to the penetrating portion of the substrate, provided with the through hole, and composed of a metal material different from the matrix metal.

According to the construction above, when the fastening member is fastened, the through hole provided in the receiving portion rather than in the substrate receives fastening force. Therefore, a substrate fracture around the through hole that may occur in a case where the through hole provided in the substrate directly receives fastening force can be prevented. In addition, as SiC in the substrate is present as SiC particles dispersed in the matrix metal, individual particles can displace independently to some extent when external force is applied. Therefore, as compared with a case where a network portion bonding SiC to one another is formed, a substrate fracture is less likely. Moreover, as the receiving portion is composed of a metal material different from the matrix metal, a material for the receiving portion can be different from any of magnesium and the magnesium alloy, and hence a material with which lowering in axial force of the fastening member is less likely can be selected. Thus, even though the magnesium-based composite member is subjected to a heat cycle, loosening of a fixed state due to lowering in axial force of the fastening member is less likely. Therefore, according to the construction above, the heat radiation member according to the present invention formed from the composite member can securely be fixed to a fixing target and this fixed state can be maintained for a long period in a stable manner. Thus, the heat radiation member according to the present invention can sufficiently dissipate heat from a semiconductor element or the like and it is excellent in heat radiation property. In addition, a semiconductor device according to the present invention including such a heat radiation member and a semiconductor element mounted on this heat radiation member is excellent in heat radiation property.

A volume ratio of SiC in the composite material can readily be increased, for example, with a manufacturing method of pouring a dissolved matrix metal into highly densely filling SiC particles. This ratio can be more than 60 volume % and further more than 75 volume %.

The receiving portion may have a protrusion buried in the substrate. As this protrusion serves as an anchor, the receiving portion is less likely to detach from the substrate.

The penetrating portion may be a hole portion provided in the substrate. Since an entire circumference of the receiving portion is thus surrounded by the substrate, the receiving portion is less likely to detach from the substrate. Alternatively, the penetrating portion may be a notch portion provided in the substrate. Thus, the receiving portion can be attached to a notch provided in the substrate, instead of the through hole provided in the substrate. In a case where the through hole to which the receiving portion is attached is provided in the substrate, a portion of the substrate located outward relative to the through hole is more likely to break. In a case where the receiving portion is attached to the notch, however, it is not necessary to provide a through hole to which the receiving portion is to be attached, and therefore such breakage can be prevented.

Advantageous Effects of Invention

The composite member according to the present invention and the heat radiation member according to the present invention formed from this composite member can securely be fixed to a fixing target. The semiconductor device according to the present invention is excellent in thermal characteristics by including the heat radiation member.

DESCRIPTION OF EMBODIMENTS

Figure 1A:
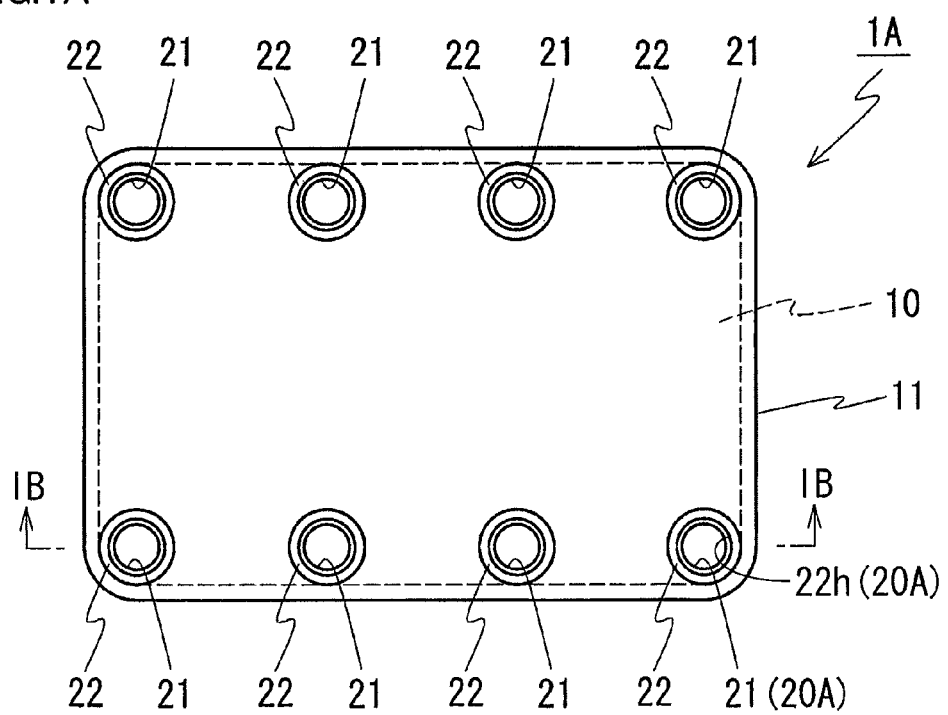
FIG. 1A is a plan view showing an overview of a composite member in Embodiment 1.

An embodiment of the present invention will be described hereinafter.

Initially, contents common to Embodiments 1 to 3 will be described.

<<Composite Member>>

As a form of the composite member according to the present invention, a form including a substrate alone composed of a composite material made of a composite of magnesium or a magnesium alloy representing a matrix metal and a non-metal inorganic material (mainly SiC) and a form including the substrate and a metal coating layer covering at least one surface of this substrate are exemplified. Since the metal coating layer has been described above, the substrate will be described here in detail.

[Matrix Metal]

What is called pure magnesium composed of 99.8 mass % or more Mg and an impurity or a magnesium alloy composed of an added element and remainder Mg and an impurity is adopted as a component for the matrix metal in the substrate. A case where pure magnesium is adopted as the matrix metal is more advantageous than a case where an alloy is adopted in that (1) a heat conduction property of the composite member is enhanced and (2) a substrate having a uniform texture is readily obtained because such a disadvantage as non-uniform precipitation of a crystallized product at the time of solidification is less likely. In a case where the magnesium alloy is adopted as the matrix metal, a liquidus temperature becomes lower and thus a temperature in melting can be lowered, and in addition corrosion resistance and mechanical characteristics (such as strength) of the substrate can be enhanced. At least one of Li, Ag, Ni, Ca, Al, Zn, Mn, Si, Cu, and Zr is exemplified as the added element. Increase in content of these elements leads to lowering in thermal conductivity, and therefore these elements are not more than 20 mass % in total (assuming the matrix metal as 100 mass %; to be understood similarly hereinafter as to the content of the added element). In particular, preferably, Al is not more than 3 mass %, Zn is not more than 5 mass %, and each of other elements is not more than 10 mass %. Addition of Li is effective for lighter weight of the composite member and improvement in workability. A known magnesium alloy such as AZ-type, AS-type, AM-type, ZK-type, ZC-type, or LA-type may be employed. A matrix metal source material is prepared so as to attain desired composition.

[Non-Metal Inorganic Material]
<Composition>

SiC is contained in the substrate. SiC achieves such excellent effects that (1) a coefficient of thermal expansion thereof is approximately from 3 ppm/K to 4 ppm/K which is close to a coefficient of thermal expansion of a semiconductor element or peripherals thereof, (2) thermal conductivity is particularly high among non-metal inorganic materials (single crystal: approximately from 390 W/m·K to 490 W/m·K), (3) powders or sintered bodies in various shapes and sizes are commercially available, and (4) mechanical strength is high. Other than the above, a non-metal inorganic material lower in coefficient of thermal expansion than Mg, excellent in heat conduction property, and less likely to react to Mg, such as at least one of $Si_3N_4$, Si, MgO, $Mg_3N_2$, $Mg_2Si$, $MgB_2$, $MgCl_2$, $Al_2O_3$, AlN, CaO, $CaCl_2$, $ZrO_2$, diamond, graphite, h-BN, c-BN, $B_4C$, $Y_2O_3$, and NaCl is allowed to be contained. The non-metal inorganic material other than SiC is present, for example, as a network portion.

<State of Presence>

As a state of presence of SiC in the substrate composed of SiC and the matrix metal, representatively a form randomly dispersed in the matrix metal (hereinafter referred to as a dispersed form) or a form bonded by the network portion (hereinafter referred to as a bonded form) is exemplified. In particular in the bonded form, such a form that SiC as a whole is continuous as being coupled by the network portion and a gap between SiC and SiC is filled with the matrix metal, that is, a porous body which will have open pores if the matrix metal should be removed from the substrate, is preferred. This porous body is preferably has fewer closed pores. Specifically, preferably, a ratio of closed pores to the total volume of the non-metal inorganic material in the substrate is not higher than 10 volume % and preferably not higher than 3 volume %. Regarding the non-metal inorganic material in the substrate, the non-metal inorganic material used as the source material is present substantially as it is. Therefore, when a porous body having few closed pores as described above is made use of as the source material, a path for infiltrating the porous body with a matrix metal melt can sufficiently be ensured and the obtained substrate itself has fewer pores because the open pores are filled with the matrix metal. By including a substrate having fewer pores, this composite member has higher thermal conductivity. Presence of a network portion or a ratio of closed pores in the composite member can be checked or measured, for example, by observing a cross-section of the composite member with an optical microscope or a scanning electron microscope (SEM).

<Content>

A content of SiC in the substrate composed of SiC and the matrix metal can be selected as appropriate. As the content of SiC is greater, thermal conductivity κ tends to become higher and coefficient of thermal expansion α tends to be lower. Therefore, in consideration of thermal characteristics, the SiC content is desirably not lower than 50 volume %, particularly higher than 70 volume %, further not lower than 75 volume %, not lower than 80 volume % among others, and preferably not lower than 85 volume %, with the substrate being defined as 100 volume %. When a content of SiC is higher than 70 volume %, a composite member can have a coefficient of thermal expansion as high as a coefficient of thermal expansion (approximately from 4 ppm/K to 8 ppm/K) of a semiconductor element and peripherals thereof and high thermal conductivity not lower than 180 W/m·K. Since such a composite member is excellent also in heat radiation property while having a low coefficient of thermal expansion adapted to a semiconductor element or the like, it can suitably be made use of as the heat radiation member of a semiconductor element. Furthermore, the composite member excellent in compatibility of coefficient of thermal expansion with a semiconductor element and peripherals thereof has low thermal stress generated in a portion of joint with a semiconductor element or the like, and in addition, prescribed joint strength can sufficiently be maintained by adopting a particular material as a constituent material for the through hole as described above. Thus, reliability of a semiconductor device including the heat radiation member can be enhanced. In addition, the composite member excellent in heat conduction property can not only enhance reliability as the heat radiation member but also achieve reduction in size of the heat radiation member and hence it can also contribute to size reduction of a semiconductor device. Taking into account industrial productivity, however, the SiC content approximately from 80 volume % to 90 volume % is considered as practical.

<Network Portion>

In the form of having a network portion, a constituent material for the network portion includes, in addition to SiC described above, non-metal inorganic materials such as a silicon nitride ($Si_3N_4$), a magnesium compound (such as $MgB_2$, MgO or $Mg_3N_2$), other nitrides (such as BN and AlN), and oxides (such as CaO), and a metal material such as Mo. Since $Si_3N_4$ has a low coefficient of thermal expansion, when the network portion is composed of $Si_3N_4$, a composite member further lower in coefficient of thermal expansion can be obtained.

As described above, depending on a manufacturing condition, a thickness of the network portion can be varied. A thickness of the network portion is defined, with any line segment having a prescribed length being taken in a cross-section of the composite member, as a length of a portion where a contour line of an SiC aggregate constituted of SiC and the network portion crosses the line segment, that is, a length between adjacent intersections, that are intersections between the contour line and the line segment. A longer length between the intersections, that is, a thick network portion, tends to be excellent in thermal characteristics and in particular low in coefficient of thermal expansion. A shorter length between the intersections, that is, a thin network portion, tends to be excellent in mechanical characteristics and in particular high in tensile strength or bending strength. As the network portion becomes thicker, the number of intersections in the line segment decreases. Therefore, taking any line segment having a length of 1 mm with respect to an actual dimension of the composite member in the cross-section of the composite member, a composite member in which the number of intersections between the contour line of the SiC aggregate constituted of SiC and the network portion and the line segment satisfies a value not larger than 50 can be defined as a composite member having a thick network portion.

<Thickness of Substrate>

A thickness of the substrate composed of SiC and the matrix metal can be selected as appropriate. In a case of use as a heat radiation member of a semiconductor element, however, the thickness is preferably not larger than 10 mm and particularly preferably not larger than 5 mm.

[Through Hole]

A size of a through hole or the number of through holes provided in the substrate or the composite member including the substrate and the metal coating layer can be selected as appropriate, and does not particularly matter. In addition, the through hole may be any of a threaded screw hole and a hole having a not-threaded, smooth surface. Furthermore, the through hole may in such a form as being subjected to countersinking. As a result of countersinking, such a head portion of the fastening member as a bolt head does not project from the surface of the composite member, and a smooth surface in a state of fixing to a fixing target can be achieved.

<<Manufacturing Method>>

The composite member according to the present invention can be manufactured representatively with a manufacturing method including a molding step of forming an SiC aggregate by making use of SiC powders, a composite step of making a composite by infiltrating the SiC aggregate accommodated in a cast with molten magnesium or magnesium alloy (hereinafter referred to as a matrix metal melt), and a hole forming step of forming a through hole through which a fastening member for attaching the obtained composite member to a fixing target is to be inserted. In manufacturing a composite member in a bonded form having a network portion, the network portion is formed as described above or with an appropriate method which will be described later. In manufacturing a composite member having a metal coating layer, the metal coating layer is formed with an appropriate method as described above.

[Source Material]

An ingot of pure magnesium or a magnesium alloy described above can suitably be made use of as the matrix metal. As a source material for the SiC aggregate, SiC powders can mainly be made use of. In particular, particulate or fibrous SiC powders having an average particle size (in a fibrous case, an average short diameter) not smaller than 1 µm and not larger than 3000 µm and in particular not smaller than 10 and not larger than 200 µm are preferred, because a powder aggregate is readily manufactured. Use of a plurality of types of powders different in average particle size as combined is likely to enhance a filling rate of SiC. Since a content of SiC in the composite member is substantially equal to an amount of a source material, an amount of a source material should be selected as appropriate such that the composite member has desired thermal characteristics. In addition, a shape of a mold filled with source material powders or a shape of a cast in which a composite of an SiC aggregate and a matrix metal is made should be selected as appropriate such that the composite member (substrate) has a prescribed shape.

[Molding Step]

A form of the SiC aggregate includes a powder molded body and a sintered body obtained by sintering a powder molded body (representatively, an SiC porous body having a network portion). In a case of increasing a content of SiC in the composite member to 50 volume % or more and particularly to more than 70 volume %, slip casting, pressure forming, and a doctor blade method can suitably be made use of for forming a powder molded body, and the obtained powder molded body has strength sufficient for handling. In a case where a content of SiC in the composite member is low, a powder molded body can sufficiently be formed also with tapping or the like.

Sintering conditions include, for example, (1) a vacuum atmosphere, a heating temperature from 800° C. to less than 1300° C., and a holding time approximately from 10 minutes to 2 hours, and (2) an atmosphere, a heating temperature from 800° C. to 1500° C., and a holding time approximately from 10 minutes to 2 hours. By performing sintering under the sintering condition above or by performing heat treatment for forming the network portion described above, advantageously, (1) a sintered body higher in strength than the powder molded body, less likely to experience chipping or the like at the time of accommodation in a cast, or the like, and easily handed is obtained, (2) a porous body can readily be fabricated, and (3) an SiC filling rate can be improved by adjusting a sintering temperature or a holding time so as to make the sintered body dense and thus a composite member of which SiC content is not lower than 70 volume % is readily obtained. Under the sintering condition (1), (2) relatively low in temperature, however, a composite member in the dispersed form not having a network portion tends to be obtained.

A commercially available SiC sintered body may be made use of as the SiC aggregate. In this case, a sintered body having a network portion that can be present in the composite member and having open pores for infiltration with a matrix metal melt should be selected as appropriate as the SiC sintered body.

As a method of forming an SiC aggregate having a network portion, in addition to a method of performing heat treatment described above, for example, the following methods are exemplified.

(1) A method of forming a powder molded body containing Si by using a powder mixture of SiC powders and powders composed of Si powders or a compound containing Si, subjecting this powder molded body to heat treatment in a nitrogen atmosphere to generate a silicon nitride, and forming a network portion with this silicon nitride.

With this method, even though a heat treatment temperature is set to a temperature as low as approximately 800° C. to 1800° C., SiC can be bonded sufficiently to one another, and in addition the network portion can be thick. The powder molded body containing Si can also be formed by making use of an oxide containing Si, such as an additive composed of ceramics, for example, $SiO_2$, $H_2SiO_3$, and $Na_2SiO_3$ and by reducing this oxide.

(2) A method of fabricating a solution of a precursor of a non-metal inorganic material (for example, polycarbosilane and metal alkoxide) described above and impregnating the powder molded body with the solution followed by heating, so as to generate a non-metal inorganic material (for example, SiC, MgO, CaO) forming the network portion from the precursor.

With this method, the network portion can be manufactured at a relatively low temperature, and in addition, in a case of newly producing SiC, density of SiC can be increased.

(3) A method of forming a powder molded body with a powder mixture of SiC powders and powders for reaction containing at least one type of boron and oxygen (for example, powders of a simple substance element such as boron, BN, $TiB_2$, boric acid ($B_2O_3$), and sodium tetraborate ($Na_2B_4O_5(OH)_4 \cdot 8H_2O$), powders of an oxide, a boride, and a boroxide), generating anew non-metal inorganic material as a result of reaction between the matrix metal melt and the powders for reaction, and forming a network portion from this product.

With this method, in forming the network portion, separate heat treatment or heating is not necessary.

(4) A method of forming a powder molded body with a powder mixture of SiC powders and precursor powders for generating an oxide or a nitride as a result of reaction to nitrogen or oxygen (for example, $SiCl_4$, organic Si compound), subjecting this powder molded body to heat treatment to generate the oxide or the nitride, and forming a network portion from this product.

With this method, the network portion can be manufactured at a relatively low temperature.

After an SiC powder molded body composed only of SiC powders is fabricated, the SiC powder molded body is impregnated with a mixture solution (such as an aqueous solution) in which separately prepared Si powders, precursor powders, powders for reaction, or the like are mixed in such a solvent as water, and then the solvent is dried. Then, a desired substance such as Si is readily uniformly dispersed in the powder molded body.

<Formation of Oxide Film>

In addition, by making use of an SiC aggregate having an oxide film formed on its surface as the SiC aggregate, wettability between the SiC aggregate and the matrix metal is enhanced, which is preferred. Even when the SiC content is high and a gap between SiC and SiC is very small, the matrix metal melt readily penetrates the SiC aggregate including the oxide film, owing to capillarity. In obtaining a composite member having a network portion, preferably, an oxidation step of forming an oxide film is provided after fabrication of the SiC aggregate such as the sintered body. In obtaining a composite member not having a network portion, an oxide film is formed on a source material powder such as an SiC powder and then the powders including the oxide film are made use of to form the SiC aggregate (powder molded body).

A condition for forming the oxide film is common in a case of powders and in a case of a sintering body and the like, and a heating temperature is preferably not lower than 700° C., in particular not lower than 750° C., further not lower than 800° C., not lower than 850° C. among others, and further preferably not lower than 875° C. and not higher than 1000° C. In addition, an oxide film is preferably formed such that a mass ratio to source material SiC is not lower than 0.4% and not higher than 1.5% (a thickness of the oxide film: approximately from 50 nm to 300 nm) and in particular not higher than 1.0%. When an SiC aggregate including the oxide film is made use of as a source material, a portion in the vicinity of SiC in the obtained composite member (a region within 100 nm to 300 nm from the contour line of the SiC aggregate) tends to be higher in oxygen concentration than a portion other than the portion in the vicinity.

[Composite Step]

The composite member (substrate) is obtained by accommodating the SiC aggregate in a cast, infiltrating the SiC aggregate with the matrix metal melt, and thereafter solidifying the matrix metal. In particular, in a case of manufacturing a composite member in a form including a metal plate forming a part of a through hole, through which a fastening member is to be inserted, as integrated therewith, the metal plate is accommodated in the cast together with the SiC aggregate, a composite of the SiC aggregate and the matrix metal melt is made, and thus the metal plate is integrated.

If the composite step is performed in an atmosphere at a pressure not higher than an atmospheric pressure (approximately 0.1 MPa (1 atm)), a gas in the atmosphere is less likely to be taken in and pores attributed to take-in of the gas are less likely to be caused. Since Mg is high in vapor pressure, handling of the matrix metal melt becomes difficult if a high vacuum state is set. Therefore, in a case where a pressure of the atmosphere in the composite step is set lower than the atmospheric pressure, a pressure not lower than $0.1 \times 10^{-5}$ MPa is preferred. Alternatively, if the composite step is performed in an inert atmosphere such as Ar, reaction between an Mg component and an atmospheric gas in particular can be prevented and deterioration in thermal characteristics attributed to presence of a reaction product can be suppressed. In a case where magnesium (pure Mg) is employed as the matrix metal, an infiltration temperature not lower than 650° C. is preferred. As the infiltration temperature is higher, wettability is enhanced and hence an infiltration temperature not lower than 700° C., in particular not lower than 800° C., and further not lower than 850° C. is preferred. If the infiltration temperature exceeds 1000° C., however, such a defect as a shrinkage cavity or a gas hole may be caused or Mg may boil. Therefore, the infiltration temperature not higher than 1000° C. is preferred. In addition, in order to suppress generation of an excessive oxide film or generation of a crystallized product, an infiltration temperature not higher than 900° C. is further preferred.

[Hole Formation Step]

A through hole through which such a fastening member as a bolt is to be inserted is formed at a desired position in the obtained composite member by machining. In particular, by making use of electric discharge machining, a through hole can readily be provided even in a case of forming a through hole in a region of the composite member where SiC is present. In such a form that a metal plate forming a part of the through hole is provided as integrated with the composite member (substrate), by providing a through hole in the metal plate as well as in the substrate composed of SiC and the matrix metal, a through hole communicating from the metal plate to the substrate can readily be provided. In the form of making use of hardware having an inner hole such as a washer or a clinching fastener, a hole is provided in the substrate and thereafter the hardware is arranged as appropriate, so that a through hole continuing to the hole provided in the substrate from the hardware or a through hole communicating with a front and a back of the composite member can be formed. In a case where at least a part of the through hole is formed of the resin described above, for example, a hole is provided in the substrate, thereafter the hole is filled with the resin, and the through hole is provided in this filled resin portion. Then, a through hole formed of the resin can readily be formed. As the through hole is formed of the resin, cell corrosion due to contact between different types of metals cannot occur.

Specific Embodiments 1 to 3 of the present invention will be described hereinafter with reference to the drawings. The same reference characters in the drawings refer to components having the same denotation. It is noted that a metal coating layer or a through hole is shown in an exaggerated manner in the drawings for the sake of ease in understanding.

[Embodiment 1]

Figure 1B:
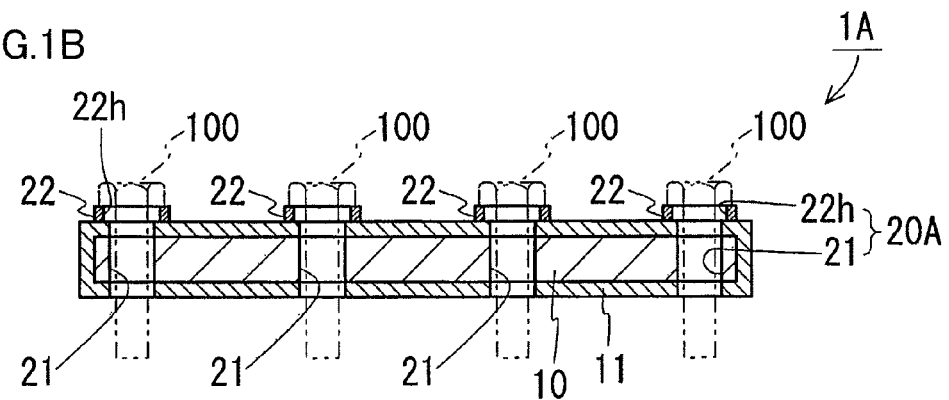
FIG. 1B is a schematic cross-sectional view along the line IB-IB in FIG. 1A.

A magnesium-based composite member 1A (also referred to as the composite member) in Embodiment 1 will be described with reference to FIGS. 1A and 1B. Composite member 1A is a magnesium-based composite member including a substrate 10 composed of a composite material which is a composite of magnesium and SiC and a metal coating layer 11 composed of magnesium and covering substantially the entire surface of substrate 10, and it includes a through hole 20A through which a bolt (fastening member) 100 for attaching composite member 1A to a fixing target (not shown) is to be inserted. A feature of this composite member 1A resides in a form of through hole 20A. Through hole 20A will mainly be described hereinafter.

Composite member 1A has a network portion bonding SiC to one another in substrate 10, and SiC in substrate 10 is in a continuous form substantially in its entirety owing to the network portion. In a region of composite member 1A where the network portion is present, a hole (substrate hole) (hereinafter referred to as a base hole 21) penetrating substrate 10 from metal coating layer 11 covering one surface of substrate 10 and reaching metal coating layer 11 covering the other surface of substrate 10 is provided A metal plate 22 (receiving portion) having an inner hole 22h (a receiving portion hole) is arranged to surround an outer circumference of base hole 21, and through hole 20A is constituted of base hole 21 and inner hole 22h in metal plate 22.

Metal plate 22 is a washer made of stainless steel, and its outer diameter is slightly greater than a standard size defined in correspondence with a size of bolt 100. Therefore, when bolt 100 is fastened to bring a head portion of bolt 100 into contact with metal plate 22, as shown in FIG. 1B, metal plate 22 sufficiently projects from a periphery of the head portion. A metal plate having an area at least 10% greater than an area of the head portion of bolt 100 in a plan view is suitably made use of as this metal plate 22.

Composite member 1A is attached to a fixing target by inserting bolt 100 into through hole 20A and fastening this bolt 100. In a state of fixing to the fixing target, the head portion of bolt 100 is in contact with metal plate 22 as described above. Namely, in composite member 1A, a portion of through hole 20A with which the head portion of bolt 100 is in contact is composed of a metal (stainless steel here) other than a matrix metal (magnesium here).

Composite member 1A was fabricated as follows. An ingot (a commercially available product) of pure magnesium composed of 99.8 mass % or more Mg and an impurity and a commercially available SiC sintered body as an SiC aggregate (an SiC porous body having a network portion composed of SiC; relative density 80%, 190 mm long×140 mm wide×4 mm thick) were prepared as source materials.

The prepared SiC aggregate was subjected to oxidation treatment at 875° C.×2 hours so as to form an oxide film, so that wettability with molten pure magnesium was enhanced. The step of oxidation treatment may not be performed.

The SiC aggregate was accommodated in a cast, the SiC aggregate was infiltrated with molten pure magnesium, and then pure magnesium was solidified.

The cast is made of carbon, is a box-shaped body in a parallelepiped shape having an opening in one direction, and is formed as one piece by combining a plurality of divided pieces. An internal space of this cast is made use of as a space for accommodating the SiC aggregate. Here, a stainless steel wire having a diameter φ of 0.5 mm is prepared as a spacer and a cast having an internal space sufficiently large to arrange the spacer between the SiC aggregate and the cast is made use of. The SiC aggregate is accommodated in this cast and the SiC aggregate is fixed to the cast with the use of the spacer such that the SiC aggregate is arranged at an appropriate position in the cast. As the SiC aggregate is fixed to the cast with the use of the spacer, the SiC aggregate is arranged in the cast in a stable manner and a gap having a size (a gap of 0.5 mm here) in accordance with a size of the spacer (a diameter here) is readily provided on a front and a back and along a periphery of a plate-shaped SiC aggregate, between the SiC aggregate and the cast.

An integrally molded cast may also be made use of, instead of a construction in which divided pieces are combined. In addition, here, the SiC aggregate was accommodated in the cast after a commercially available release agent had been applied to a portion of contact of an inner surface of the cast with the SiC aggregate. Release of the composite member can be facilitated by applying the release agent. The step of applying this release agent may not be performed.

The cast has an ingot placement portion coupled to a periphery of an opening portion, on which the prepared ingot is arranged. By heating this cast to a prescribed temperature, the ingot is molten. Heating of the cast is carried out by loading the cast into an atmosphere furnace capable of heating.

Here, the atmosphere furnace was adjusted such that the infiltration temperature was set to 775° C., an Ar atmosphere was set, and a pressure in the atmosphere was set to an atmospheric pressure. Molten pure magnesium flowed into the internal space of the cast through the opening portion of the cast and the SiC aggregate arranged in the internal space was infiltrated therewith. In addition, as molten pure magnesium flows into the gap between the cast and the SiC aggregate provided by the spacer, metal coating layer 11 composed of pure magnesium is formed on opposing two surfaces and along the periphery of composite substrate 10.

After infiltration, the cast was cooled to thereby solidify pure magnesium. Here, a bottom side was positively cooled such that cooling was achieved in one direction from the bottom portion of the cast toward the opening portion. By carrying out such cooling, internal defects can be decreased even in a large-sized composite member and a composite member of high quality is obtained. In a case of a small-sized composite member, a composite member of high quality is obtained without cooling in one direction as described above.

Base hole 21 is formed at a desired position in the obtained composite product (190 mm long×140 mm wide×5 mm thick) by machining (electric discharge machining here). Here, four base holes 21 on each longer edge side of composite member 1A, that is, a total of 8 base holes 21, are provided. Then, by arranging metal plate 22 around base hole 21, composite member 1A in which a part of through hole 20A is composed of a metal other than the matrix metal is obtained.

In composite member 1A constructed as above, a part of through hole 20A, in particular, a portion with which the head portion of bolt 100 is in contact, is composed of a metal of high strength and high toughness other than the matrix metal, and therefore composite member 1A can sufficiently receive fastening force of bolt 100 at metal plate 22. In particular, in composite member 1A, metal plate 22 has such a size as sufficiently projecting from the periphery of bolt 100. Therefore, composite member 1A can effectively prevent production a fracture in the vicinity of base hole 21 at the time of fastening of bolt 10, even though it is in the form having a network portion bonding SiC to one another. In addition, since the portion with which the head portion of bolt 100 is in contact is composed of a metal of high strength and high toughness, even though composite member 1A is subjected to a heat cycle, creep can be less likely to occur or lowering in axial force of bolt 100 can be suppressed, and thus loosening of a state of fixing to a fixing target is less likely. Therefore, composite member 1A is expected to be able to maintain a state of secure fixing to a fixing target for a long period since initial fixing.

Components of obtained composite member 1A were examined with the use of an EDX apparatus. Then, the components were Mg and SiC and the remainder of inevitable impurities, that were the same as in the used source materials. In addition, obtained composite member 1A was subjected to a CP (Cross-section Polisher) process to expose a cross-section, that was examined in SEM observation. Then, SiC in composite member 1A exhibited web-like appearance and SiC was directly bonded to each other. Namely, such a porous body that a network portion was formed of SiC was obtained, that was the same as in the sintered body of the used source materials. The cross-section of obtained composite member 1A was observed with an optical microscope. Then, it could be confirmed that a gap between SiC and SiC was infiltrated with pure magnesium and metal coating layer 11 composed of pure magnesium was provided on the surface of substrate 10. Moreover, composition of the matrix metal in substrate 10 and a constituent metal for metal coating layer 11 was examined with the EDX apparatus, and then the composition was the same (pure magnesium). Furthermore, it was confirmed in an observed image of the cross-section that each metal coating layer 11 formed on both surfaces of substrate 10 had a texture continuous to pure magnesium in substrate 10. In addition, a thickness of each metal coating layer 11 was measured by using the observed image of the cross-section. Then, it could be confirmed that the thickness was approximately 0.5 mm (500 µm), which substantially matched with the size of the spacer described above.

In addition, a content of SiC in a substrate 10 portion in obtained composite member 1A was measured and it was 80 volume %. Regarding the SiC content, any cross-section of the composite member was observed with an optical microscope (×50 magnification), the observed image was subjected to image processing with a commercially available image analysis apparatus, a total area of SiC in this cross-section was found, a value obtained by converting this total area into a volume ratio was adopted as a volume ratio based on this cross-section (area ratio volume ratio), a volume ratio in the cross-section for n=3 was found, and an average value thereof was calculated.

Moreover, coefficient of thermal expansion α (ppm/K) and thermal conductivity κ (W/m·K) of obtained composite member 1A were measured, and coefficient of thermal expansion α was 5.1 ppm/K and thermal conductivity κ was 250 W/m·K. The coefficient of thermal expansion and the thermal conductivity were measured by cutting a test piece from composite member 1A and by using a commercially available measurement instrument. The coefficient of thermal expansion was measured in a range from 30° C. to 150° C.

From the foregoing, it can be seen that obtained composite member 1A is excellent in compatibility with a semiconductor element and peripherals thereof having a coefficient of thermal expansion around 4 ppm/K, also high in thermal conductivity, and excellent in thermal characteristics. In addition, composite member 1A can securely be fixed to a fixing target as described above. Therefore, composite member 1A is expected to suitably be made use of as a constituent material for a heat radiation member of a semiconductor element.

Moreover, as composite member 1A has metal coating layer 11 on both surfaces of substrate 10, Ni plating or the like can readily be provided thereon through electroplating, and solderability can be enhanced by plating. Further, as composite member 1A has its entire surface composed of a single metal (includes metal coating layer 11), it can readily be subjected to surface working such as surface polishing, grinding, or the like.

Though a commercially available SiC sintered body is made use of as the SiC aggregate in Embodiment 1, for example, an SiC sintered body may be fabricated, for example, by fabricating a powder molded body and then subjecting the molded body to heat treatment as appropriate as described above, which is also the case with Embodiments 2 and 3 which will be described later.

In addition, though the form including the metal coating layer has been described in Embodiment 1, a form not including a metal coating layer but including only a substrate is applicable. In this case, for example, a cast having an internal space of a size in accordance with an SiC aggregate and having substantially no gap between the SiC aggregate and the cast when the SiC aggregate is accommodated in the cast can be exemplified as the cast. Alternatively, a form may be such that a metal coating layer is provided only on any one surface of the substrate. In this case, the spacer described above should be arranged only on one surface of the SiC aggregate. In Embodiments 2 and 3 which will be described later, a metal coating layer is preferably provided on at least one surface. By selecting as appropriate a thickness or a shape of a spacer in forming a metal coating layer, a thickness or a region of formation of a metal coating layer can readily be varied.

[Embodiment 2]

Figure 2A:
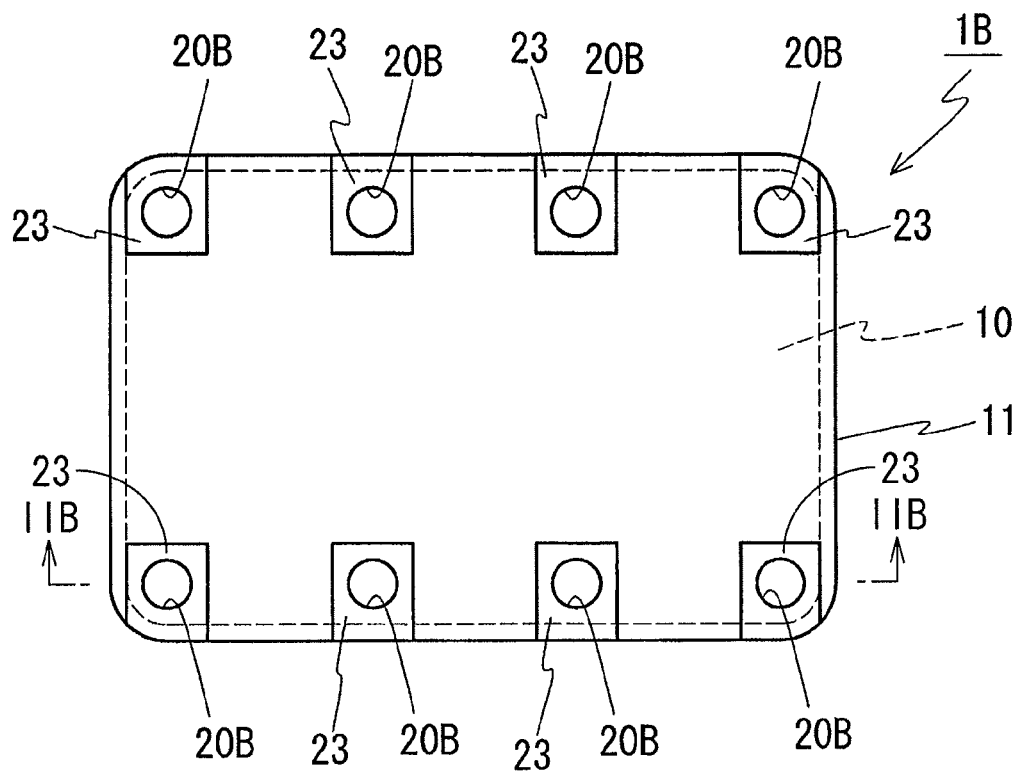
FIG. 2A is a plan view showing an overview of a composite member in Embodiment 2.
Figure 2B:
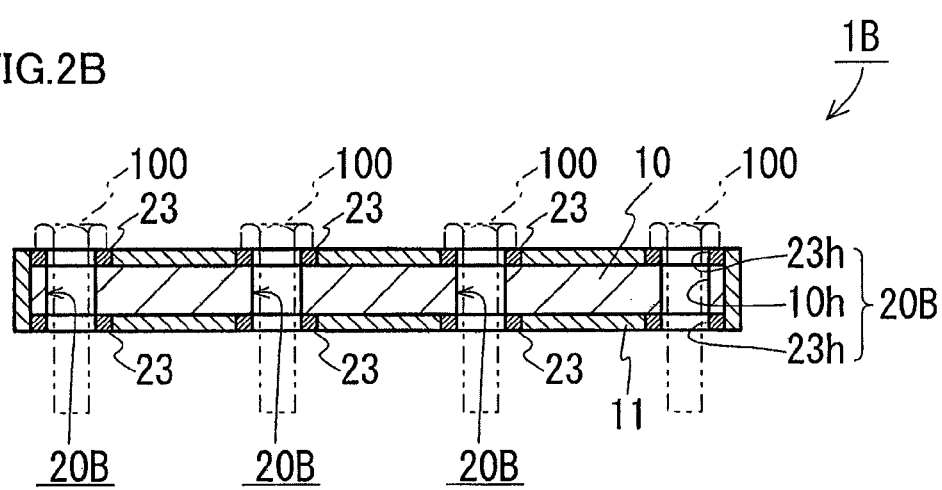
FIG. 2B is a schematic cross-sectional view along the line IIB-IIB in FIG. 2A.

A magnesium-based composite member 1B in Embodiment 2 will be described with reference to FIGS. 2A and 2B. A basic construction of composite member 1B is the same as composite member 1A in Embodiment 1, and composite member 1B includes substrate 10 composed of a composite material which is a composite of magnesium and SiC and metal coating layer 11 composed of magnesium. In addition, composite member 1B also includes a through hole 20B through which bolt 100 is to be inserted, in a region where a network portion bonding SiC to one another is present. Composite member 1B in Embodiment 2 is different from composite member 1A in Embodiment 1 in a form of through hole 20B. Through hole 20B will mainly be described hereinafter, and detailed description of a feature the same as in Embodiment 1 will not be provided.

In composite member 1B, a metal plate 23 (receiving portion) made of stainless steel is arranged at each of opposing positions in metal coating layer 11 present on the front and the back of substrate 10, one surface of metal plate 23 is exposed at the surface of metal coating layer 11, and a periphery of metal plate 23 is joined to metal coating layer 11. Through hole 20B is provided to penetrate substrate 10 from metal plate 23 arranged on one surface of substrate 10 to metal plate 23 arranged on the other surface of substrate 10. Namely, through hole 20B is constituted of a substrate hole 10h provided in substrate 10 and a plate hole 23h (receiving portion hole) provided in each of both metal plates 23. Then, in composite member 1B as well, a portion of through hole 20B with which the head portion of bolt 100 is in contact is composed of a metal (stainless steel here) other than the matrix metal (magnesium here).

Metal plate 23 is a bent plate in a shape like], and it is arranged to sandwich the front and the back of substrate 10. Metal plate 23 is substantially the same in thickness as metal coating layer 11. In addition, an area of a portion of metal plate 23 arranged on the front and the back of substrate 10 and exposed through metal coating layer 11 has a size allowing sufficient projection of metal plate 23 from the periphery of the head portion of bolt 100 as shown in FIG. 2B when bolt 100 is fastened and the head portion thereof is in contact with metal plate 23. A metal plate having an area at least 10% greater than an area of the head portion of bolt 100 in a plan view is suitably made use of as this metal plate 23.

Composite member 1B can be manufactured similarly to composite member 1A in Embodiment 1 described above. It is noted that, in composite member 1B, metal plate 23 also functions as a spacer in forming the metal coating layer described above. Specifically, metal plate 23 in a] shape is attached at a desired position of the SiC aggregate so as to sandwich the SiC aggregate, and the SiC aggregate is accommodated in the cast described above in this state. By doing so, the SiC aggregate is arranged in the cast in a stable manner owing to metal plate 23, and a gap in accordance with a thickness of metal plate 23 (a gap of 0.5 mm here) is readily provided on the front and the back and along the periphery of the plate-shaped SiC aggregate, between the SiC aggregate and the cast. Then, by making a composite of the SiC aggregate and the matrix metal melt as described above to thereby form substrate 10 and causing the melt to flow into the gap, metal coating layer 11 is formed, and at the same time enveloped casting of metal plate 23 is carried out. Thus, metal plate 23 is joined to and integrated with substrate 10 and metal coating layer 11.

The surface of metal plate 23 in the] shape is exposed at a part of the front and the back and at a part of a peripheral portion of obtained composite member 1B (190 mm long× 140 mm wide×5 mm thick). Through hole 20B is formed by machining (electric discharge machining here) in metal plate 23 exposed in this composite member 1B and in a portion of substrate 10 sandwiched by metal plate 23. Here, four through holes 20B on each longer edge side of composite member 1B, that is, a total of 8 through holes 20B, are provided.

In composite member 1B constructed as above, a part of through hole 20B, in particular, a portion with which the head portion of bolt 100 is in contact, is composed of a metal of high strength and high toughness other than the matrix metal, and therefore composite member 1B can sufficiently receive fastening force of bolt 100 at metal plate 23. In particular, in composite member 1B as well, metal plate 23 has such a size as sufficiently projecting from the periphery of bolt 100. Therefore, composite member 1B is also expected (1) to be able to prevent occurrence of a fracture in the vicinity of substrate hole 10h at the time of fastening of bolt 100 even though it is in the form having a network portion bonding SiC to one another and (2) to be less likely to experience loosening of a state of fixing even though it is subjected to a heat cycle. In addition, composite member 1B includes metal plate 23 on the front and the back thereof and metal plate 23 is present also at the portion in contact with the fixing target while it is attached to the fixing target. Therefore, composite member 1B is likely to maintain a state of intimate contact with a fixing target even though it is subjected to a heat cycle and resultant creep strain or the like is caused in the matrix metal. From the foregoing, composite member 1B is expected to be able to maintain a state of secure fixing to a fixing target for a long period since initial fixing. Furthermore, since any surface on the front and the back of composite member 1B can be made use of as a surface with which the head portion of bolt 100 is in contact, composite member 1B is also excellent in workability in fixing. Moreover, since metal plate 23 is integrated with composite member 1B, it is not necessary to arrange a separate member for receiving axial force of bolt 100 at the time of attachment to a fixing target, and workability in fixing is excellent also in this regard. Furthermore, since metal coating layer 11 and metal plate 23 are flush with each other and thus composite member 1B has a smooth surface, composite member 1B has excellent appearance.

Though a portion composed of a metal different in type from the matrix metal is formed on both surfaces of substrate 10 by making use of metal plate 23 in the] shape in Embodiment 2, for example, by making use of a metal plate in an L shape, a portion composed of a metal different in type from the matrix metal can readily be formed only on one surface of substrate 10.

In addition, though a thickness of metal plate 23 is equal to a thickness of metal coating layer 11 in Embodiment 2, they may be different from each other. For example, by arranging a spacer in a cast as appropriate, the metal plate can be different in thickness from the metal coating layer while the metal plate is joined to the metal coating layer. For example, a form may be such that metal plate 23 is smaller in thickness than metal coating layer 11 and the metal plate is embedded in the metal coating layer. In this case, for example, a form may be such that the entire surface of the composite member is composed of a single metal, and this form achieves such an effect that plating or the like can readily be provided and workability in surface polishing, grinding, or the like is excellent. Such a composite member can be manufactured, for example, as follows. A plate smaller in thickness than the metal coating layer is prepared as a bent plate in a] shape described above, and an SiC aggregate is attached thereto as described above. Then, the SiC aggregate is fixed to a cast by using a spacer such as a wire of an appropriate size as described in Embodiment 1. Thus, a metal coating layer in accordance with a size of a wire can be provided and the metal plate can be embedded in the metal coating layer. A state of embedding of the metal plate can readily be checked, for example, by making use of X-ray CT or the like.

Further, in addition to the construction in Embodiment 2, a form in combination with metal plate 22 in Embodiment 1 is applicable, which is also the case with Embodiment 3 which will be described later.

[Embodiment 3]

Figure 3A:
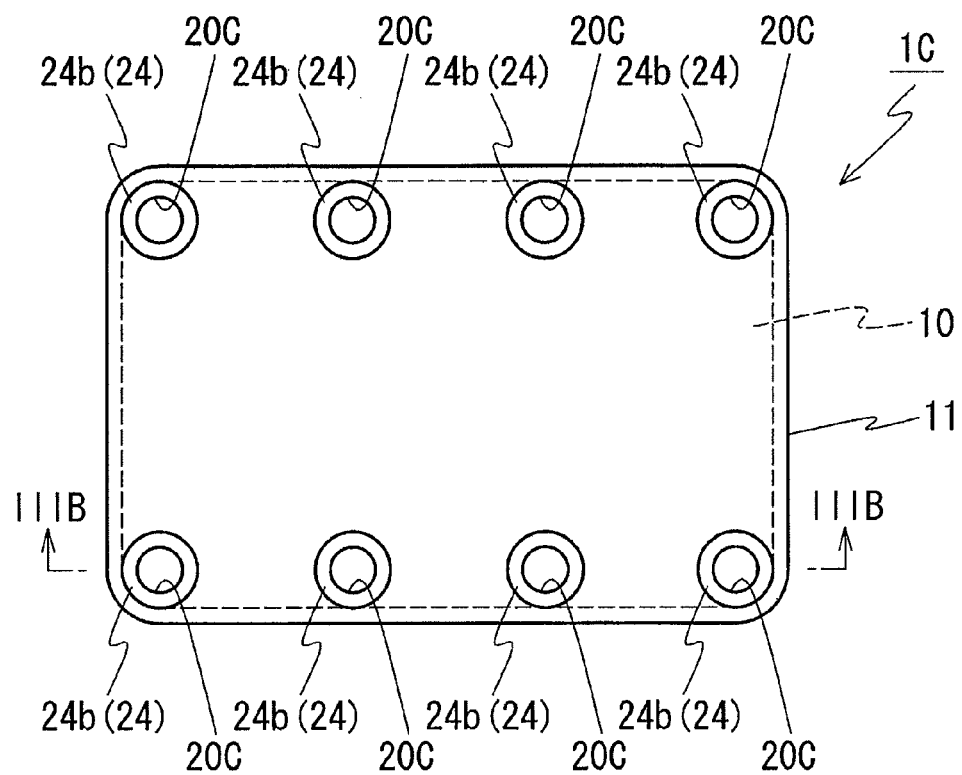
FIG. 3A is a plan view showing an overview of a composite member in Embodiment 3.
Figure 3B:
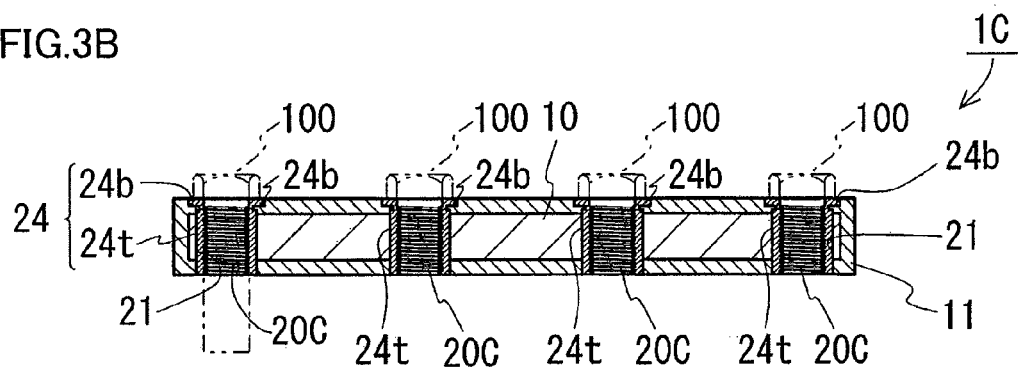
FIG. 3B is a schematic cross-sectional view along the line IIIB-IIIB in FIG. 3A.

A magnesium-based composite member 1C in Embodiment 3 will be described with reference to FIGS. 3A and 3B. A basic construction of composite member 1C is the same as composite member 1A in Embodiment 1, and composite member 1C includes substrate 10 composed of a composite material which is a composite of magnesium and SiC and metal coating layer 11 composed of magnesium. In addition, composite member 1C also includes a through hole 20C through which bolt 100 is to be inserted, in a region where a network portion bonding SiC to one another is present. Composite member 1C in Embodiment 3 is different from composite member 1A in Embodiment 1 in a form of through hole 20C. Through hole 20C will mainly be described hereinafter, and detailed description of a feature the same as in Embodiment 1 will not be provided.

In composite member 1C, through hole 20C continuing from the front to the back of composite member 1C is formed by an inner hole in hardware 24 including a metal plate 24b (receiving portion) and a cylindrical portion 24t coupled to this metal plate 24b. One surface of metal plate 24b and an end surface of cylindrical portion 24t are exposed at opposing positions in metal coating layer 11 present on the front and the back of substrate 10, respectively, and a cylindrical outer circumferential surface of hardware 24 is generally covered with substrate 10. In addition, a periphery of metal plate 24b is joined to metal coating layer 11. Then, in composite member 1C as well, a portion of through hole 20C with which the head portion of bolt 100 is in contact is composed of a metal (stainless steel here) other than the matrix metal (magnesium here).

Hardware 24 is a commercially available clinching fastener made of stainless steel. Therefore, through hole 20C is composed of a single metal in its entirety. Namely, an inner circumferential surface of through hole 20C is also composed of a metal of the same type as metal plate 24b. In composite member 1C including such hardware 24, a metal different from the matrix metal is present over the entire length in a direction of thickness. Then, a metal different from this matrix metal (stainless steel here) can support substantially the entire pressure applied by fastening of bolt 100. Therefore, an area of a portion of metal plate 24b exposed through metal coating layer 11 does not have to have a size allowing sufficient projection of metal plate 24b from the periphery of the head portion as shown in FIG. 3B, in a state that bolt 100 is fastened and the head portion of bolt 100 is in contact with metal plate 24b. Namely, an area of metal plate 24b may be, for example, equal to or smaller than an area of the head portion of bolt 100 in a plan view, or may be greater than the area in the plan view as in Embodiments 1, 2. In addition, unlike through holes 20A, 20B in Embodiments 1, 2 having an inner circumferential surface of a hole formed from a smooth surface, through hole 20C is a threaded screw hole. Though a fastener having a screw hole is made use of as a clinching fastener, a fastener having an inner circumferential surface of a hole formed from a smooth surface may be made use of.

Composite member 1C (190 mm long×140 mm wide×5 mm thick) is attached to a fixing target by screwing bolt 100 in through hole 20C and fastening this bolt 100.

Composite member 1C can also be manufactured similarly to composite member 1A in Embodiment 1 described above. It is noted that, in composite member 1C, through hole 20C is provided by forming base hole 21 and thereafter press-fitting hardware 24 in base hole 21. Here, four base holes 21 on each longer edge side of composite member 1C, that is, a total of 8 base holes 21, are provided, and hardware 24 is press-fitted in each of them. By press-fitting hardware 24, a constituent metal for metal coating layer 11 enters a step portion between metal plate 24b and cylindrical portion 24t, so that hardware 24 is securely fixed to composite member 1C.

In composite member 1C constructed as above, a part of through hole 20C, in particular, a portion with which the head portion of bolt 100 is in contact, is composed of a metal of high strength and high toughness other than the matrix metal, and therefore composite member 1C can sufficiently receive fastening force of bolt 100 at metal plate 24b. In particular, in composite member 1C, as entire through hole 20C is composed of a metal other than the matrix metal, a constituent metal for through hole 20C can receive substantially 100% of axial force of bolt 100. Therefore, composite member 1C is expected (1) to be able to more effectively prevent occurrence of a fracture in the vicinity of base hole 21 at the time of fastening of bolt 100 even though it is in the form having a network portion bonding SiC to one another and (2) to be further less likely to experience loosening of a state of fixing even though it is subjected to a heat cycle. In addition, since composite member 1C has a screw hole as through hole 20C, through hole 20C can be coupled to bolt 100 by screwing and a property of intimate contact with the fixing target can be enhanced. Furthermore, since hardware 24 is integrated with composite member 1C, it is not necessary to arrange a separate member for receiving axial force of bolt 100, and workability in fixing is excellent as in Embodiment 2.

Embodiments 1 to 3 have been described above.

Contents common to Embodiments 4 to 7 will now be described hereinafter.

<<Composite Member>>

As a form of the composite member according to the present invention, a form consisting only of a substrate composed of a composite material which is a composite of magnesium or a magnesium alloy representing a matrix metal and a non-metal inorganic material (mainly SiC) and a form including the substrate and a metal coating layer covering at least one surface of this substrate are exemplified. Each form has a metal region composed of a matrix metal. The substrate will initially be described.

[Matrix Metal]

It is assumed that a component of the matrix metal in the substrate and forming the metal region is what is called pure magnesium composed of 99.8 mass % or more Mg and an impurity or a magnesium alloy composed of an added element and remainder Mg and an impurity. A case where pure magnesium is adopted as the matrix metal is more advantageous than a case where an alloy is adopted in that (1) a heat conduction property of the composite member is enhanced and (2) the substrate or the metal region having a uniform texture is readily obtained because such a disadvantage as non-uniform precipitation of a crystallized product at the time of solidification is less likely. In a case where the magnesium alloy is adopted as the matrix metal, a liquidus temperature becomes lower and thus a temperature in melting can be lowered, and in addition corrosion resistance and mechanical characteristics (such as strength) of the substrate or the metal region can be enhanced. At least one of Li, Ag, Ni, Ca, Al, Zn, Mn, Si, Cu, and Zr is exemplified as the added element. Increase in content of these elements leads to lowering in thermal conductivity, and therefore these elements are preferably not more than 20 mass % in total (assuming the matrix metal as 100 mass %; to be understood similarly hereinafter as to the content of the added element). In particular, preferably, Al is not more than 3 mass %, Zn is not more than 5 mass %, and each of other elements is not more than 10 mass %. Addition of Li is effective for lighter weight of the composite member and improvement in workability. A known magnesium alloy such as AZ-type, AS-type, AM-type, ZK-type, ZC-type, or LA-type may be employed. A matrix metal source material is prepared so as to attain a desired composition.

[Non-Metal Inorganic Material]
<Composition>

The substrate contains SiC. SiC has such excellent effects as (1) having a coefficient of thermal expansion approximately from 3 ppm/K to 4 ppm/K which is close to a coefficient of thermal expansion of a semiconductor element or peripherals thereof, (2) having particularly high thermal conductivity among non-metal inorganic materials (single crystal: approximately from 390 W/m·K to 490 W/m·K), (3) being commercially available as powders or sintered bodies in various shapes and sizes, and (4) having high mechanical strength. In addition, a non-metal inorganic material lower in coefficient of thermal expansion than Mg, excellent in thermal conductivity, and less likely to react to Mg such as at least one of $Si_3N_4$, Si, MgO, $Mg_3N_2$, $Mg_2Si$, $MgB_2$, $MgCl_2$, $Al_2O_3$, AlN, CaO, $CaCl_2$, $ZrO_2$, diamond, graphite, h-BN, c-BN, $B_4C$, $Y_2O_3$, and NaCl can be allowed to be contained. The non-metal inorganic material other than SiC is present, for example, as a network portion bonding SiC to one another.

<State of Presence>

SiC in the substrate composed of SiC and a matrix metal is present representatively in a form randomly dispersed in the matrix metal (hereinafter referred to as a dispersed form) or in a form bonded by the network portion (hereinafter referred to as a bonded form). In particular in the bonded form, such a form that SiC as a whole is continuous as being bonded by the network portion and a gap between SiC and SiC is filled with a matrix metal, that is, a porous body which will have open pores if the matrix metal should be removed from the substrate, is preferred. This porous body is preferably has fewer closed pores. Specifically, preferably, a ratio of closed pores to the total volume of the non-metal inorganic material in the substrate is not higher than 10 volume % and further not higher than 3 volume %. Regarding the non -metal inorganic material in the substrate, the non-metal inorganic material used as the source material is present substantially as it is. Therefore, as a porous body having few closed pores as described above is made use of as the source material, a path for infiltration of the porous body with the matrix metal melt can sufficiently be ensured and the obtained substrate itself has fewer pores because the open pores are filled with the matrix metal. A substrate having fewer pores will provide higher thermal conductivity of this composite member. Presence of a network portion or a ratio of closed pores in the composite member can be checked or measured, for example, by observing a cross-section of the composite member with an optical microscope or a scanning electron microscope (SEM).

<Content>

A content of SiC in the substrate composed of SiC and the matrix metal can be selected as appropriate. As the content of SiC is greater, thermal conductivity κ tends to become higher and coefficient of thermal expansion α tends to be lower. Therefore, in consideration of thermal characteristics, the SiC content is desirably not lower than 50 volume %, particularly higher than 70 volume %, further not lower than 75 volume %, not lower than 80 volume % among others, and preferably not lower than 85 volume %, with the substrate being defined as 100 volume %. When a content of SiC is higher than 70 volume %, a composite member can have a coefficient of thermal expansion as high as a coefficient of thermal expansion (approximately from 4 ppm/K to 8 ppm/K) of a semiconductor element and peripherals thereof and high thermal conductivity not lower than 180 W/m·K. Since such a composite member is excellent also in heat radiation property while having a low coefficient of thermal expansion adapted to a semiconductor element or the like, it can suitably be made use of as a heat radiation member of a semiconductor element. Furthermore, the composite member excellent in compatibility of coefficient of thermal expansion with a semiconductor element and peripherals thereof has low thermal stress generated in a portion of joint with a semiconductor element or the like, and in addition, prescribed joint strength can sufficiently be maintained by adopting a particular material as a constituent material for the through hole as described above. Thus, reliability of a semiconductor device including the heat radiation member can be enhanced. In addition, the composite member excellent in heat conduction property can not only enhance reliability as the heat radiation member but also achieve reduction in size of the heat radiation member, and hence it can also contribute to size reduction of a semiconductor device. Taking into account industrial productivity, however, the SiC content approximately from 80 volume % to 90 volume % is considered as practical.

<Network Portion>

In the form of having a network portion, a content of SiC can readily be increased, and it can be, for example, 50 volume % or higher and can further be more than 70 volume %, so that a composite member low in coefficient of thermal expansion can be obtained. In addition, according to the form above, since a continuous path for heat conduction is formed by SiC and the matrix metal, a composite member excellent in heat conduction property can be obtained. Therefore, according to the form above, a composite member suitable for a heat radiation member of a semiconductor element can be obtained.

A constituent material for the network portion is represented by SiC. In addition, non-metal inorganic materials such as a silicon nitride ($Si_3N_4$), a magnesium compound (such as $MgB_2$, MgO or $Mg_3N_2$), other nitrides (such as BN and AlN), and oxides (such as CaO) and a metal material such as Mo are exemplified. Since $Si_3N_4$ has a low coefficient of thermal expansion, when the network portion is composed of $Si_3N_4$, a composite member further lower in coefficient of thermal expansion can be obtained.

As will be described later, depending on a manufacturing condition, a thickness of the network portion can be varied. A thickness of the network portion is defined, with any line segment having a prescribed length being taken in a cross-section of the composite member, as a length of a portion where a contour line of an SiC aggregate constituted of SiC and the network portion crosses the line segment, that is, a length between adjacent intersections, that are intersections between the contour line and the line segment. A longer length between the intersections, that is, a thick network portion, tends to be excellent in thermal characteristics and in particular low in coefficient of thermal expansion. A shorter length between the intersections, that is, a thin network portion, tends to be excellent in mechanical characteristics and in particular high in tensile strength or bending strength. As the network portion becomes thicker, the number of intersections in the line segment decreases. Therefore, taking any line segment having a length of 1 mm with respect to an actual dimension of the composite member in the cross-section of the composite member, a composite member in which the number of intersections between the contour line of the SiC aggregate constituted of SiC and the network portion and the line segment satisfies a value not larger than 50 can be defined as a composite member having a thick network portion.

<Thickness of Substrate>

A thickness of the substrate composed of SiC and the matrix metal can be selected as appropriate. In a case where this substrate is made use of as a heat radiation member of a semiconductor element, however, the thickness is preferably not larger than 10 mm and particularly preferably not larger than 5 mm.

[Metal Coating Layer]

In a case of solder joint in making use of the composite member for the heat radiation member, Ni plating or the like is desirably provided in order to enhance solderability. Here, by providing a metal coating layer on the surface of the substrate, conduction can be achieved by making use of the metal coating layer. Therefore, electroplating can be made use of and plating can readily be formed. Additionally, as the metal coating layer is provided, such effects as (1) excellent appearance and (2) improvement in corrosion resistance can also be expected.

The constituent metal for the metal coating layer may be identical to or different from the matrix metal in composition. In a case of the same composition, when the metal coating layer is formed simultaneously with making of a composite of an SiC aggregate and a matrix metal melt as will be described later, a composite member having the metal coating layer can be manufactured with good productivity. In this case, in the obtained composite member, the matrix metal in the substrate and the metal forming the metal coating layer have a continuous texture (cast texture).

In a case where the matrix metal for the substrate is different in composition from the constituent metal for the metal coating layer, the constituent metal for the metal coating layer is exemplified, for example, by an Mg alloy different in composition from the matrix metal and metals other than Mg and the Mg alloy such as one type of metal selected from the group consisting of Al, Cu, Ni of which purity is not lower than 99% and an alloy mainly composed of Al, Cu, Ni (an alloy containing more than 50 mass % of Al, Cu, Ni).

A region where the metal coating layer is formed and a thickness thereof can be selected as appropriate. For example, at least a surface requiring plating out of surfaces forming a substrate, specifically, at least one of a mount surface on which a semiconductor element is to be mounted and a cooled surface opposed to this mount surface and being in contact with a cooling device, is exemplified. In addition, the form may be such that the metal coating layer is present also on the metal region described above.

A thickness of each metal coating layer can be selected as appropriate. Too large a thickness of each metal coating layer, however, leads to increase in coefficient of thermal expansion of the composite member or lowering in thermal conductivity of the composite member, and therefore, a thickness not greater than 2.5 mm, particularly not greater than 1 mm, and further not greater than 0.5 mm, is preferred. A thickness not smaller than 1 μm, particularly not smaller than 0.05 mm (50 μm) and not greater than 0.1 mm (100 μm), sufficiently achieves a function as a base for plating, and in addition, breakage of the metal coating layer during transportation, mount or the like of the composite member is less likely. The metal coating layer may be formed to have a large thickness and a desired thickness may be set by polishing or the like.

[Metal Region]

One feature of the composite member according to the present invention is to have a metal region composed of the matrix metal and provided with a through hole through which a fastening member is to be inserted. A size and a shape of this metal region as well as the number of metal regions to be formed and a portion of formation thereof can be selected as appropriate, in accordance with a size of the fastening member, the number of fastening members, a portion of arrangement of the fastening member, or the like. In a case where the composite member is made use of for a heat radiation member of a semiconductor element, provision of a metal region in a region on a peripheral side of the composite member will readily ensure a sufficient mount area for such parts as a semiconductor element. This metal region is provided with a through hole described above, and the metal region includes a portion (representatively, an embedded member described above) composed of a material different from the matrix metal forming the metal region, in at least a part in a direction of thickness thereof. A portion of the metal region except for the embedded member or the like has substantially the same composition as the matrix metal for the substrate and has a continuous texture.

[Through Hole]

A size of a through hole or the number of through holes can be selected as appropriate, and does not particularly matter. In addition, the through hole may be any of a threaded screw hole and a hole having a not-threaded, smooth surface. In a case where the through hole is composed substantially of a metal material, threading can readily be performed to provide a screw hole. Further, the through hole can be in such a form as being subjected to countersinking. As a result of countersinking, such a head portion of the fastening member as a bolt head does not project from the surface of the composite member and a smooth surface in a state of fixing to a fixing target can be achieved.

[Thermal Characteristics]

By increasing a filling rate of SiC or providing a network portion as described above, a composite member having high thermal conductivity $\kappa$ and low coefficient of thermal expansion $\alpha$, for example, a coefficient of thermal expansion not lower than 4 ppm/K and not higher than 8 ppm/K and thermal conductivity not lower than 180 W/m·K, can be obtained. Although depending on a content of SiC, a form of a network portion, composition of a matrix metal, or the like, a composite member having thermal conductivity $\kappa$ not lower than 200 W/m·K, particularly not lower than 250 W/m·K, and further not lower than 300 W/m·K, can be obtained. It is noted that, in a case where the composite member is made use of as a heat radiation member of a semiconductor element or the like, a coefficient of thermal expansion or thermal conductivity is measured in a portion except for a portion where a semiconductor element or the like is not arranged, that is, a portion of the metal plate or the like where a through hole is formed as described above. A coefficient of thermal expansion of the composite member including the form including the metal coating layer can easily be found by fabricating a test piece from the composite member and conducting measurement using a commercially available apparatus. Alternatively, a coefficient of thermal expansion of the composite member including the metal coating layer may be calculated based on mixture rules in consideration of rigidity or the like of each material forming the composite member.

<<Manufacturing Method>>

The composite member according to the present invention can be manufactured representatively with a manufacturing method including a molding step of forming an SiC aggregate by making use of SiC powders, a composite step of making a composite by infiltrating the SiC aggregate accommodated in a cast with molten magnesium or magnesium alloy (hereinafter referred to as a matrix metal melt), and a hole forming step of forming a through hole through which a fastening member for attaching the obtained composite member to a fixing target is to be inserted. In particular, in the composite step, simultaneously with making of a composite, a metal region at least a part of which is composed of a matrix metal is formed. In manufacturing a composite member in a bonded form having a network portion, the network portion is formed with an appropriate method which will be described later. In manufacturing a composite member having a metal coating layer, the metal coating layer is formed with an appropriate method which will be described later.

[Source Material]

An ingot of pure magnesium or a magnesium alloy described above can suitably be made use of as the matrix metal. As a source material for the SiC aggregate, SiC powders can mainly be made use of. In particular, particulate or fibrous SiC powders having an average particle size (in a fibrous case, an average short diameter) not smaller than 1 μm and not larger than 3000 μm and in particular not smaller than 10 μm and not larger than 200 μm are preferred, because a powder aggregate is readily manufactured. Use of a plurality of types of powders different in average particle size as combined is likely to further enhance a filling rate of SiC. Since a content of SiC in the composite member is substantially equal to an amount of a source material, an amount of a source material should be selected as appropriate such that the composite member has desired thermal characteristics. In addition, a shape of a mold filled with source material powders or a shape of a cast in which a composite of an SiC aggregate and a matrix metal is made should be selected as appropriate such that the composite member (substrate) has a prescribed shape.

[Molding Step]

A form of the SiC aggregate includes a powder molded body and a sintered body obtained by sintering a powder molded body (representatively, an SiC porous body having a network portion). A powder molded body can be formed, for example, with any one of tapping, slip casting (molding slurry including source material powders, water, and a dispersant, and then drying the slurry), pressure forming (dry pressing, wet pressing, single-shaft pressure forming, CIP (cold isostatic press), extrusion, and the like), and a doctor blade method (pouring slurry including source material powders, a solvent, an antifoaming agent, a resin, and the like into a doctor blade, and thereafter evaporating the solvent). In a case of increasing a content of SiC in the composite member to 50 volume % or more and particularly to more than 70 volume %, slip casting, pressure forming, and a doctor blade method can suitably be made use of for forming a powder molded body, and the obtained powder molded body has strength sufficient for handling. In a case where a content of SiC in the composite member is low, a powder molded body can sufficiently be formed also with tapping or the like.

Sintering conditions include, for example, (1) a vacuum atmosphere, a heating temperature from 800° C. to less than 1300° C., and a holding time approximately from 10 minutes to 2 hours, and (2) an atmosphere, a heating temperature from 800° C. to 1500° C., and a holding time approximately from 10 minutes to 2 hours. Under condition (1), (2), a composite member in a dispersed form not having a network portion tends to be obtained. On the other hand, when sintering under such conditions as a vacuum atmosphere, a heating temperature not lower than 1300° C. and not higher than 2500° C., and a holding time for 2 hours is performed, SiC can directly be bonded to one another, a network portion can be formed of SiC, and in addition an SiC porous body excellent in strength is obtained. In particular, when a heating temperature is set to 2000° C. or higher, a network portion can have a greater thickness. When the heating temperature is lower than 2000° C., a network portion tends to be thinner. The heating temperature or the holding time above should be selected as appropriate in accordance with a desired form. By performing sintering above, advantageously, (1) a sintered body higher in strength than the powder molded body, less likely to experience chipping or the like at the time of accommodation in a cast, or the like, and easily handed is obtained, (2) a porous body can readily be fabricated, and (3) an SiC filling rate can be improved by adjusting a sintering temperature or a holding time so as to make the sintered body dense and thus a composite member of which SiC content is not lower than 70 volume % is readily obtained. By making use of the SiC aggregate (representatively, an SiC porous body) having a network portion as a source material, a composite member having a network portion is readily obtained.

A commercially available SiC sintered body may be made use of as the SiC aggregate. In this case, a sintered body having a network portion that can be present in the composite member and having open pores for infiltration with a matrix metal melt should be selected as appropriate as the SiC sintered body.

As a method of forming an SiC aggregate having a network portion, in addition to a method of sintering described above, for example, the following methods are exemplified.

(1) A method of forming a powder molded body containing Si by using a powder mixture of SiC powders and powders composed of Si powders or a compound containing Si, subjecting this powder molded body to heat treatment in a nitrogen atmosphere to generate a silicon nitride, and forming a network portion with this silicon nitride.

With this method, even though a heat treatment temperature is set to a temperature as low as approximately 800° C. to 1800° C., SiC can be bonded sufficiently to one another, and in addition the network portion can be thick. The powder molded body containing Si can also be formed by using an oxide containing Si, such as an additive composed of ceramics, for example, $SiO_2$, $H_2SiO_3$, and $Na_2SiO_3$ and by reducing this oxide.

(2) A method of fabricating a solution of a precursor of a non-metal inorganic material described above (for example, polycarbosilane and metal alkoxide) and impregnating the powder molded body with the solution followed by heating, so as to generate a non-metal inorganic material (for example, SiC, MgO, CaO) forming the network portion from the precursor.

With this method, the network portion can be manufactured at a relatively low temperature, and in addition, in a case of newly producing SiC, density of SiC can be increased.

(3) A method of forming a powder molded body with a powder mixture of SiC powders and powders for reaction containing at least one type of boron and oxygen (for example, powders of a simple substance element such as boron, BN, $TiB_2$, boric acid ($B_2O_3$), and sodium tetraborate ($Na_2B_4O_5(OH)_4 \cdot 8H_2O$), powders of an oxide, a boride, and a boroxide), generating a new non-metal inorganic material as a result of reaction between the matrix metal melt and the powders for reaction, and forming a network portion from this product.

With this method, in forming the network portion, separate heat treatment or heating is not necessary.

(4) A method of forming a powder molded body with a powder mixture of SiC powders and precursor powders for generating an oxide or a nitride as a result of reaction to nitrogen or oxygen (for example, SiCl$_4$, organic Si compound), subjecting this powder molded body to heat treatment to generate the oxide or the nitride, and forming a network portion from this product.

With this method, the network portion can be manufactured at a relatively low temperature.

After an SiC powder molded body composed only of SiC powders is fabricated, the SiC powder molded body is impregnated with a mixture solution (such as an aqueous solution) in which separately prepared Si powders, precursor powders, powders for reaction, or the like are mixed in such a solvent as water, and then the solvent is dried. Then, a desired substance such as Si is readily uniformly dispersed in the powder molded body.

<Formation of Oxide Film>

In addition, by making use of an SiC aggregate having an oxide film formed on its surface as the SiC aggregate, wettability between the SiC aggregate and the matrix metal is enhanced, which is preferred. Even when the SiC content is high and a gap between SiC and SiC is very small, the matrix metal melt readily penetrates the SiC aggregate including the oxide film, owing to capillarity. In obtaining a composite member having a network portion, preferably, an oxidation step of forming an oxide film is provided after fabrication of the SiC aggregate such as the sintered body. In obtaining a composite member not having a network portion, an oxide film is formed on a source material powder such as an SiC powder and then the powders including the oxide film should be used to form the SiC aggregate (powder molded body).

A condition for forming the oxide film is common in a case of powders and in a case of a sintering body and the like, and a heating temperature is preferably not lower than 700° C., in particular not lower than 750° C., further not lower than 800° C., not lower than 850° C. among others, and further preferably not lower than 875° C. and not higher than 1000° C. In addition, an oxide film is preferably formed such that a mass ratio to source material SiC is not lower than 0.4% and not higher than 1.5% (a thickness of the oxide film: approximately from 50 nm to 300 nm) and in particular not higher than 1.0%. When an SiC aggregate including the oxide film is made use of as a source material, a portion in the vicinity of SiC in the obtained composite member (a region within 100 nm to 300 nm from the contour line of the SiC aggregate) tends to be higher in oxygen concentration than a portion other than the portion in the vicinity.

[Composite Step]

The composite member (substrate) is obtained by accommodating the SiC aggregate in a cast, infiltrating the SiC aggregate with the matrix metal melt, and thereafter solidifying the matrix metal. In forming the metal region described above, for example, an SiC aggregate having strength to such an extent that it is free-standing in a cast such as a sintered body described above and having an appropriate outer shape (for example, an irregular shape or a shape having holes) such that a metal region is formed is made use of. By arranging this SiC aggregate in a cast and filling a recess portion or the like provided in the SiC aggregate with a matrix metal melt, the metal region can readily be formed. In particular, by accommodating the SiC aggregate (representatively, the sintered body) having this appropriate outer shape and the embedded member described above in the cast to form a substrate and form a metal region with the use of the matrix metal melt as well as by carrying out enveloped casting of the embedded member, a composite member in which the substrate, the metal region, and the embedded member are integrated with one another can readily be formed. Alternatively, in a case of forming the SiC aggregate with tapping or the like described above, for example, by accommodating a metal body (which may include the embedded member described above) composed of a metal of the same type as the matrix metal in a cast, filling the cast with SiC powders or arranging the metal body in a powder molded body after filling the cast with SiC powders, and thereafter forming the substrate with the use of the matrix metal melt and carrying out enveloped casting of the metal body as well, a composite member including the metal region made of the matrix metal and the embedded member can be formed. As the metal body has a portion composed of a metal of the same type as the matrix metal, it is excellent in intimate contact property. Alternatively, a spacer made of such a material as sublimating and disappearing as a result of heat generated during making of a composite, such as naphthalene, is accommodated in a cast together with SiC powders and the matrix metal melt flows into a space formed as a result of disappearance of the spacer, to thereby be able to form the metal region. In a case of forming an SiC aggregate by blending fine SiC powders, it is considered that the aggregate is less likely to collapse in spite of creation of the space and thus the metal region can be formed.

If the composite step is performed in an atmosphere at a pressure not higher than an atmospheric pressure (approximately 0.1 MPa (1 atm)), a gas in the atmosphere is less likely to be taken in and pores attributed to take-in of the gas are less likely to be caused. Since Mg is high in vapor pressure, handling of the matrix metal melt becomes difficult if a high vacuum state is set. Therefore, in a case where a pressure of the atmosphere in the composite step is set lower than the atmospheric pressure, a pressure not lower than $0.1 \times 10^{-5}$ MPa is preferred. Alternatively, if the composite step is performed in an inert atmosphere such as Ar, reaction between an Mg component and an atmospheric gas in particular can be prevented and deterioration in thermal characteristics attributed to presence of a reaction product can be suppressed. In a case where magnesium (pure Mg) is employed as the matrix metal, an infiltration temperature not lower than 650° C. is preferred. As the infiltration temperature is higher, wettability is enhanced and hence an infiltration temperature not lower than 700° C., in particular not lower than 800° C., and further not lower than 850° C. is preferred. If the infiltration temperature exceeds 1000° C., however, such a defect as a shrinkage cavity or a gas hole may be caused or Mg may boil. Therefore, the infiltration temperature not higher than 1000° C. is preferred. In addition, in order to suppress generation of an excessive oxide film or generation of a crystallized product, an infiltration temperature not higher than 900° C. is further preferred.

In manufacturing a composite member including a metal coating layer identical in composition to a matrix metal, for example, by using an SiC porous body having the network portion described above as a source material, the composite member can readily be manufactured because it can retain its shape by itself. Specifically, the metal coating layer can be formed by arranging such an SiC aggregate as the SiC porous body in a cast, maintaining such a state that a prescribed gap is provided between the cast and the SiC aggregate, and pouring the matrix metal melt in this gap.

In order to reliably maintain a gap between the cast and the SiC aggregate, a spacer can separately be made use of. As this spacer, a spacer removable through sublimation as a result of heat generated during making of a composite, such as naphthalene, or a spacer excellent in heat resistance, such as carbon, iron, and stainless steel (for example, SUS430), can be made use of. This spacer may remain buried in the metal coating layer, or a spacer portion may be removed by cutting or the like. For example, when a linear body having a diameter slightly smaller than a metal coating layer to be formed is prepared as a spacer and an SiC aggregate is fixed to a cast by using this linear body to thereby provide a gap in accordance with a diameter of the linear body between the SiC aggregate and the cast, most part of the linear body is buried in the metal coating layer. Thus, even when the linear body is allowed to remain, a composite member having good appearance is obtained.

In manufacturing a composite member including a metal coating layer different in composition from the matrix metal, for example, a metal plate for forming a metal coating layer (hereinafter referred to as a coated plate) is prepared as appropriate and at least one technique of brazing, ultrasonic bonding, enveloped casting, rolling (clad rolling), hot pressing, oxide soldering, and joint with an inorganic adhesive can suitably be made use of. Each technique can be made use of also in a case of manufacturing a composite member in which the matrix metal and the metal coating layer are identical in composition to each other. In a case of using the coated plate, the metal coating layer may be formed by joining a metal plate forming a part of a through hole at an appropriate portion in advance by press-fitting or the like, such that this metal plate is arranged in the metal region described above.

[Hole Formation Step]

A through hole through which such a fastening member as a bolt is to be inserted is formed at a desired position in the metal region of the obtained composite member by machining. In a case where a portion where a through hole is formed is composed of a metal material, the through hole can readily be formed by drilling. In a case where the embedded member described above is provided in the metal region, a through hole communicating with the front and the back of the composite member is readily provided by providing the through hole in the constituent metal for the metal region and the embedded member or only in the embedded member. In the form of making use of hardware having an inner hole such as a clinching fastener described above, a hole is provided in the metal region and thereafter the hardware is press-fitted therein, so that a through hole communicating with the front and the back of the composite member is readily provided. In a case where the cylindrical metal mass described above is made use of and a hole provided in advance is made use of as a through hole, the step of forming a through hole by machining is not necessary. Alternatively, a through hole may be provided by carrying out enveloped casting of the cylindrical metal mass in which a core (for example, a core composed of a material having excellent heat resistance such as a non-metal material including carbon and a metal material including iron and an alloy thereof) is inserted and thereafter removing the core by machining or the like. In a case where at least a part of the through hole is formed of the resin described above, for example, a hole is provided in the metal region of the composite member, thereafter the hole is filled with the resin, and the through hole is provided in this filled resin portion. Then, the through hole formed of the resin can readily be formed. As the through hole is formed of the resin, cell corrosion due to contact between different types of metals cannot occur.

Specific Embodiments 4 to 7 of the present invention will be described hereinafter with reference to the drawings. The same reference characters in the drawings refer to components having the same denotation. It is noted that a metal coating layer or a through hole is shown in an exaggerated manner in the drawings for the sake of ease in understanding.

[Embodiment 4]

Figure 4A:
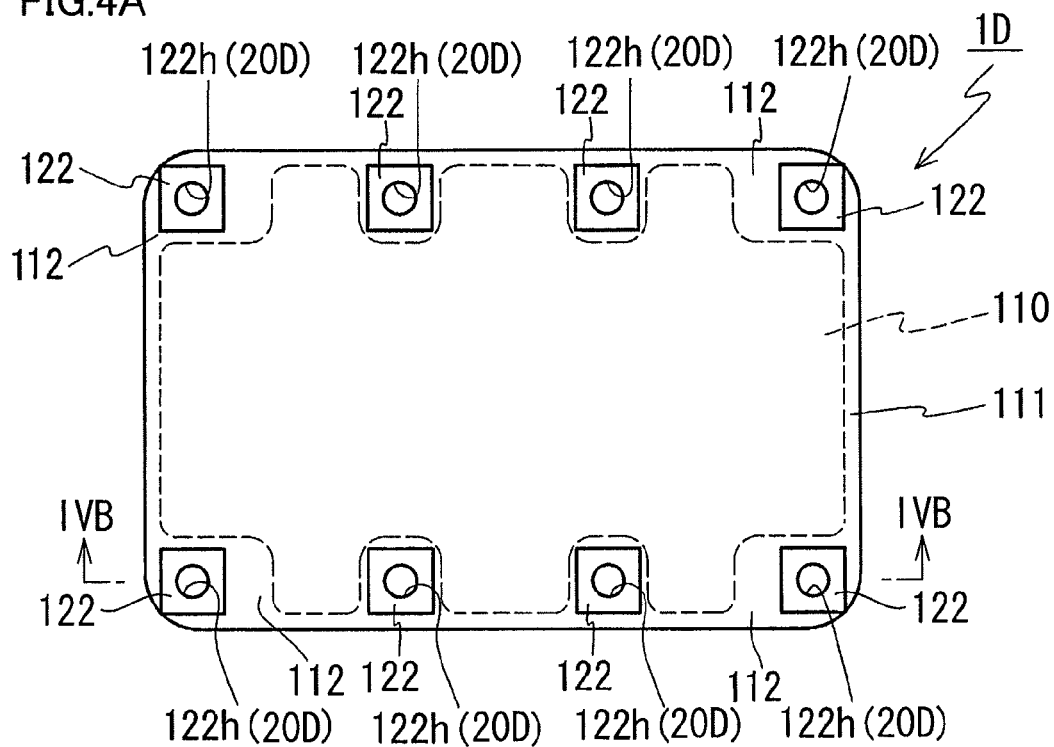
FIG. 4A is a plan view showing an overview of a composite member in Embodiment 4.
Figure 4B:
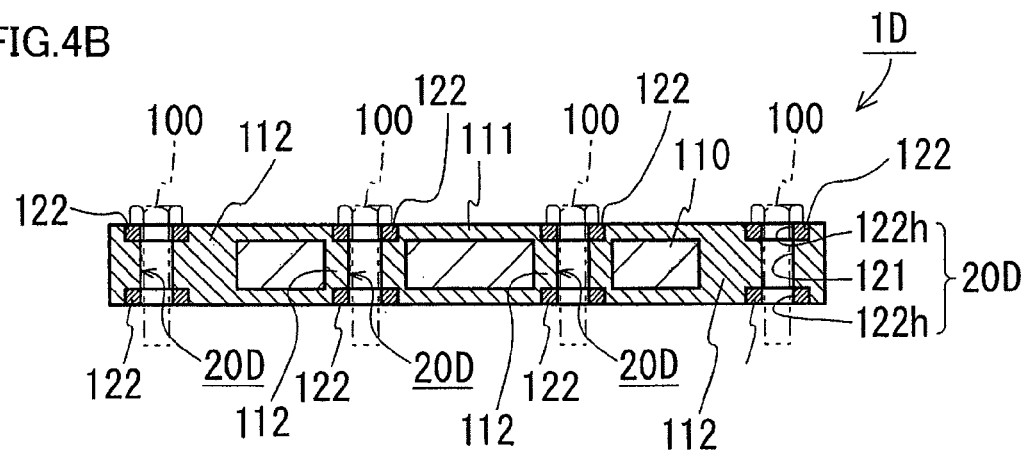
FIG. 4B is a schematic cross-sectional view along the line IVB-IVB in FIG. 4A.

A magnesium-based composite member 1D in Embodiment 4 will be described with reference to FIGS. 4A and 4B. Composite member 1D is a magnesium-based composite member including a substrate 110 composed of a composite material which is a composite of magnesium and SiC and a metal coating layer 111 composed of magnesium and covering substantially the entire surface of substrate 110, and it has a metal region 112 not containing SiC but composed of magnesium. Then, a through hole 20D through which bolt (fastening member) 100 for attachment of composite member 1D to a fixing target (not shown) is to be inserted is provided in this metal region 112. A feature of this composite member 1D resides in a form of through hole 20D. Through hole 20D will mainly be described hereinafter.

Composite member 1D has a network portion bonding SiC to one another in substrate 110, and SiC in substrate 110 is in a continuous form substantially in its entirety owing to the network portion. An outer shape of this substrate 110 is irregular as shown in FIG. 4A and it has a plurality of recess portions on a longer edge side of rectangular composite member 1D, and metal region 112 is present to bury each recess portion. A metal plate 122 (receiving portion) is arranged at each of opposing positions on front and back surfaces of each metal region 112, one surface of metal plate 122 is exposed at the surface of metal region 112, and the remaining portion of metal plate 122 is embedded in metal region 112. Each metal plate 122 is provided with a plate hole 122h (receiving portion hole), and a hole continuing to plate hole 122h (metal region hole) (hereinafter referred to as a base hole 121) is provided in a region in metal region 112 lying between opposing metal plates 122. Then, one plate hole 122h, base hole 121, and the other plate hole 122h constitute through hole 20D.

Metal plate 122 is made of stainless steel. An area of metal plate 122 can be selected as appropriate. Here, such a metal plate that metal plate 122 sufficiently projects from a periphery of the head portion of bolt 100 as shown in FIG. 4B when bolt 100 is fastened and the head portion thereof is in contact with metal plate 122, specifically, a metal plate at least 10% greater than an area of the head portion of bolt 100 in a plan view, can suitably be made use of. By doing so, metal plate 122 can sufficiently receive axial force of bolt 100.

Composite member 1D is attached to a fixing target by inserting bolt 100 into through hole 20D and fastening this bolt 100. In a state of fixing to the fixing target, the head portion of bolt 100 is in contact with metal plate 122 as described above. Namely, in composite member 1D, a portion of through hole 20D with which the head portion of bolt 100 is in contact is composed of a metal (stainless steel here) other than a constituent metal for metal region 112 (magnesium here), and the remaining portion is mainly composed of a constituent metal for metal region 112. Thus, through hole 20D is composed of a plurality of different types of metal materials.

Composite member 1D was fabricated as follows. An ingot (a commercially available product) of pure magnesium composed of 99.8 mass % or more Mg and an impurity and a commercially available SiC sintered body as an SiC aggregate (an SiC porous body having a network portion composed of SiC; relative density 80%, a rectangular size for enveloping the SiC porous body of 190 mm long×140 mm wide×4 mm thick; having a recess portion on a longer edge side) were prepared as source materials.

The prepared SiC aggregate was subjected to oxidation treatment at 875° C.×2 hours so as to form an oxide film, so that wettability with molten pure magnesium was enhanced. The step of oxidation treatment above may not be performed.

The SiC aggregate was accommodated in a cast and the SiC aggregate was infiltrated with molten pure magnesium, and then pure magnesium was solidified.

The cast is made of carbon, is a box-shaped body in a parallelepiped shape having an opening in one direction, and is formed as one piece by combining a plurality of divided pieces. An internal space of this cast is made use of as a space for accommodating the SiC aggregate. Here, a stainless steel wire having a diameter φ of 0.5 mm is prepared as a spacer and a cast having an internal space sufficiently large to arrange the spacer between the SiC aggregate and the cast is made use of. The SiC aggregate is accommodated in this cast and the SiC aggregate is fixed to the cast with the use of the spacer such that the SiC aggregate is arranged at an appropriate position in the cast. As the SiC aggregate is fixed to the cast with the use of the spacer, the SiC aggregate is arranged in the cast in a stable manner and a gap having a size (a gap of 0.5 mm here) in accordance with a size of the spacer (a diameter here) is readily provided on a front and a back and along a periphery of a plate-shaped SiC aggregate, between the SiC aggregate and the cast.

In addition, a plurality of metal bodies obtained by joining a pair of metal plates 122 by welding or the like at opposing positions of a parallelepiped casting composed of magnesium (a total thickness: 5 mm) are prepared, the SiC aggregate is accommodated in the cast, and the metal bodies are accommodated such that the metal bodies are arranged in respective recess portions in the SiC aggregate.

An integrally molded cast may be made use of, instead of a construction in which divided pieces are combined. In addition, here, the SiC aggregate was accommodated in the cast after a commercially available release agent had been applied to a portion of contact of an inner surface of the cast with the SiC aggregate. Release of the composite member can be facilitated by applying the release agent. The step of applying this release agent may not be performed.

The cast has an ingot placement portion coupled to a periphery of an opening portion, on which the prepared ingot is arranged. By heating this cast to a prescribed temperature, the ingot is molten. Heating of the cast is carried out by loading the cast into an atmosphere furnace capable of heating.

Here, the atmosphere furnace was adjusted such that the infiltration temperature was set to 775° C., an Ar atmosphere was set, and a pressure in the atmosphere was set to an atmospheric pressure. Molten pure magnesium flowed into the internal space of the cast through the opening portion of the cast and the SiC aggregate arranged in the internal space was infiltrated therewith. In addition, as molten pure magnesium flows into the gap between the cast and the SiC aggregate provided by the spacer, metal coating layer 111 composed of pure magnesium is formed on opposing two surfaces and along the periphery of composite substrate 110. Moreover, as pure magnesium flows into the recess portions in the SiC aggregate, metal region 112 composed of pure magnesium is formed, enveloped casting of the metal body including metal plate 122 described above is carried out, and metal plate 122 is integrated with substrate 110 and metal coating layer 111.

After infiltration, the cast was cooled to thereby solidify pure magnesium. Here, a bottom side was positively cooled such that cooling was achieved in one direction from the bottom portion of the cast toward the opening portion. By carrying out such cooling, internal defects can be decreased even in a large-sized composite member and a composite member of high quality is obtained. In a case of a small-sized composite member, a composite member of high quality is obtained without cooling in one direction as described above.

Through hole 20D is formed in a metal plate 122 portion in the obtained composite product (190 mm long×140 mm wide×5 mm thick) by machining (drilling here). Here, four through holes 20D on each longer edge side of composite member 1D, that is, a total of 8 through holes 20D, are provided. Through the step, composite member 1D in which a part of through hole 20D is composed of a metal other than a constituent metal for metal region 112 (matrix metal) is obtained. Though an inner circumferential surface of through hole 20D is a smooth surface in FIG. 4A, the through hole may be a threaded screw hole, which is also the case with Embodiments 5 to 7 which will be described later.

In composite member 1D constructed as above, a part of through hole 20D, in particular, a portion with which the head portion of bolt 100 is in contact, is composed of a metal of high strength and high toughness other than the matrix metal, and therefore composite member 1D can sufficiently receive fastening force of bolt 100 at metal plate 122. Therefore, even though composite member 1D is subjected to a heat cycle, creep can be less likely to occur or lowering in axial force of bolt 100 can be suppressed, and thus loosening of a state of fixing to a fixing target is less likely. Therefore, composite member 1D is expected to be able to maintain a state of secure fixing to a fixing target for a long period.

In addition, composite member 1D achieves the following effects.

(1) Since through hole 20D can be formed by drilling, workability in drilling is excellent.

(2) Since metal coating layer 111, metal plate 122, and metal region 112 are flush with one another and a surface is smooth, appearance is excellent.

(3) By including metal plate 122 on the front and the back of composite member 1D, in a state of attachment to a fixing target, metal plate 122 is present also in a portion in contact with a fixing target. Therefore, in spite of a heat cycle performed, creep strain or the like is less likely to occur in the matrix metal. In this regard as well, composite member 1D is expected to be able to maintain a state of secure fixing to a fixing target for a long period.

(4) Since any surface on the front and the back of composite member 1D can be made use of as a surface with which the head portion of bolt 100 is in contact, composite member 1D is excellent in workability in attachment.

(5) Since metal plate 122 is integrated with composite member 1D, it is not necessary to arrange a separate member for receiving axial force of bolt 100, and workability in fixing to a fixing target is excellent.

Components of obtained composite member 1D were examined with the use of the EDX apparatus. Then, the components were Mg and SiC in a portion of substrate 110, the components were inevitable impurities in the remaining portion thereof, and the components were Mg and inevitable impurities in a portion of metal region 112 except for metal plate 122, that were the same as in the used source materials. Obtained composite member 1D was subjected to a CP (Cross-section Polisher) process to expose a cross-section, that was examined in SEM observation. Then, SiC in composite member 1D exhibited web-like appearance and SiC was directly bonded to each other. Namely, such a porous body that a network portion was formed of SiC was obtained, that was the same as in the sintered body of the used source materials. The cross-section of obtained composite member 1D was observed with an optical microscope. Then, it could be confirmed that a gap between SiC and SiC was infiltrated with pure magnesium, metal coating layer 111 composed of pure magnesium was provided on the surface of substrate 110, and metal region 112 mainly composed of pure magnesium was provided in the recess portion in substrate 110. Moreover, composition of the matrix metal in substrate 110, a constituent metal for metal coating layer 111, and a constituent metal for metal region 112 except for metal plate 122 was examined with the EDX apparatus, and then the composition was substantially the same (pure magnesium). Further, it could be confirmed in an observed image of the cross-section that each metal coating layer 111 formed on both surfaces of substrate 110 and metal region 112 formed in the recess portion in substrate 110 had a texture continuous to pure magnesium in substrate 110. Furthermore, a thickness of each metal coating layer 111 was measured by using the observed image of the cross-section.

Then, it could be confirmed that the thickness was approximately 0.5 mm (500 μm), which substantially matched with the size of the spacer described above.

In addition, a content of SiC in a portion of substrate 110 in obtained composite member 1D was measured and it was 80 volume %. Regarding the SiC content, any cross-section of the composite member was observed with an optical microscope (×50 magnification), the observed image was subjected to image processing with a commercially available image analysis apparatus, a total area of SiC in this cross-section was found, a value obtained by converting this total area into a volume ratio was adopted as a volume ratio based on this cross-section (area ratio≈volume ratio), a volume ratio in the cross-section for n=3 was found, and an average value thereof was calculated.

Moreover, coefficient of thermal expansion α (ppm/K) and thermal conductivity κ (W/m·K) of obtained composite member 1D were measured, and coefficient of thermal expansion α was 5.1 ppm/K and thermal conductivity κ was 250 W/m·K. The coefficient of thermal expansion and the thermal conductivity were measured by cutting a test piece from a portion of composite member 1D except for metal region 112 and by using a commercially available measurement instrument. The coefficient of thermal expansion was measured in a range from 30° C. to 150° C.

From the foregoing, it can be seen that obtained composite member 1D is excellent in compatibility with a semiconductor element and peripherals thereof having a coefficient of thermal expansion around 4 ppm/K, also high in thermal conductivity, and excellent in thermal characteristics. In addition, composite member 1D can securely be fixed to a fixing target as described above. Therefore, composite member 1D is expected to suitably be made use of as a constituent material for a heat radiation member of a semiconductor element.

Moreover, as composite member 1D has its surface composed of a metal, such as metal coating layer 111, metal region 112, or metal plate 122, Ni plating or the like can readily be provided thereon through electroplating, and solderability can be enhanced by plating.

Though a commercially available SiC sintered body is made use of as the SiC aggregate in Embodiment 4, for example, an SiC sintered body can be fabricated by fabricating a powder molded body and then subjecting the molded body to heat treatment as appropriate as described above, which is also the case with Embodiments 5 to 7 which will be described later.

In addition, though the form including the metal coating layer has been described in Embodiment 4, a form not including a metal coating layer but including only a substrate is applicable. In this case, for example, a cast having an internal space having a size in accordance with an SiC aggregate and having substantially no gap between the SiC aggregate and the cast when the SiC aggregate is accommodated in the cast can be exemplified as the cast. Alternatively, a form may be such that a metal coating layer is provided only on any one surface of the substrate. In this case, the spacer described above should be arranged only on one surface of the SiC aggregate. By selecting a thickness or a shape of a spacer as appropriate in forming a metal coating layer, a thickness or a region of formation of a metal coating layer can readily be varied. For example, such a form that the entire surface of the composite member is covered with the metal coating layer and the surface is composed of the matrix metal, that is, the metal plate is embedded, is applicable. As the entire surface of the composite member is composed of a single metal, plating or the like can readily be provided or workability in surface polishing, grinding, or the like is excellent. A state of embedding of the embedded member can readily be checked, for example, by making use of X-ray CT or the like.

[Embodiment 5]

Figure 5A:
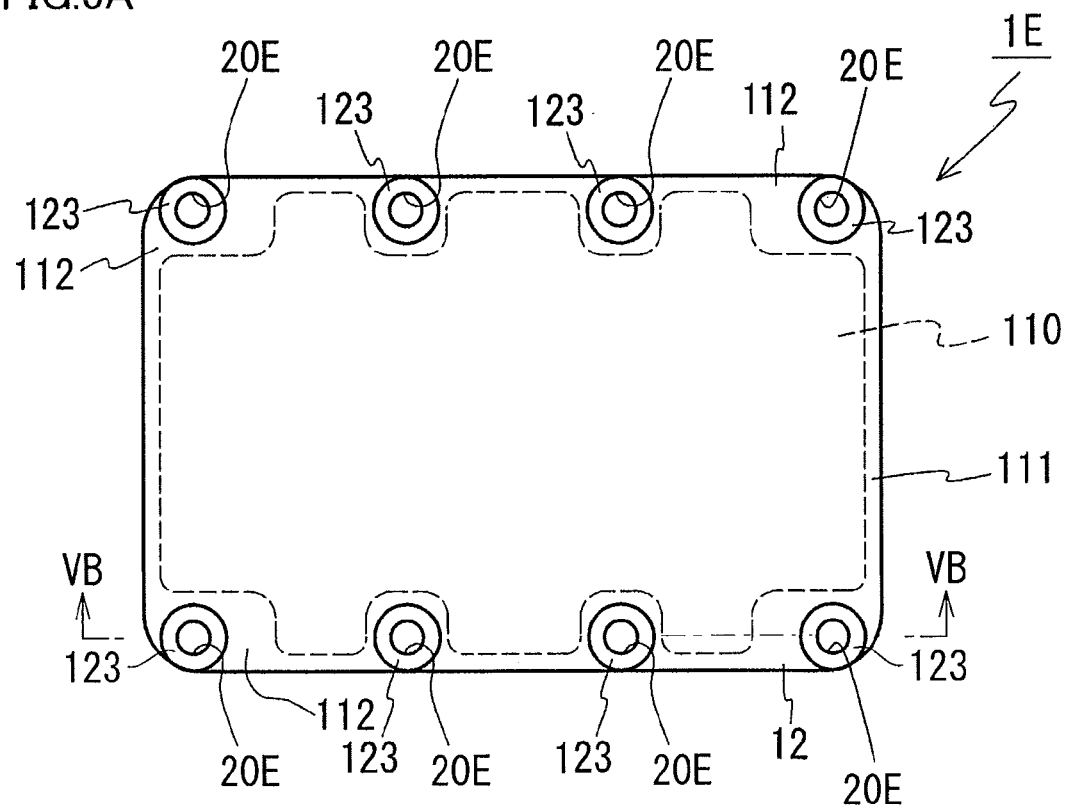
FIG. 5A is a plan view showing an overview of a composite member in Embodiment 5.

A magnesium-based composite member 1E in Embodiment 5 will be described with reference to FIGS. 5A and 5B. A basic construction of composite member 1E is the same as composite member 1D in Embodiment 4, and composite member 1E includes substrate 110 composed of a composite material which is a composite of magnesium and SiC and having an irregular shape, metal coating layer 111 composed of magnesium, and metal region 112 not containing SiC but composed of magnesium. In addition, a hole for providing a through hole 20E through which bolt 100 is to be inserted (metal region hole) is formed in metal region 112. Composite member 1E in Embodiment 5 is different from composite member 1D in Embodiment 4 in a form of through hole 20E. Through hole 20E will mainly be described hereinafter, and detailed description of a feature the same as in Embodiment 4 will not be provided.

Figure 5B:
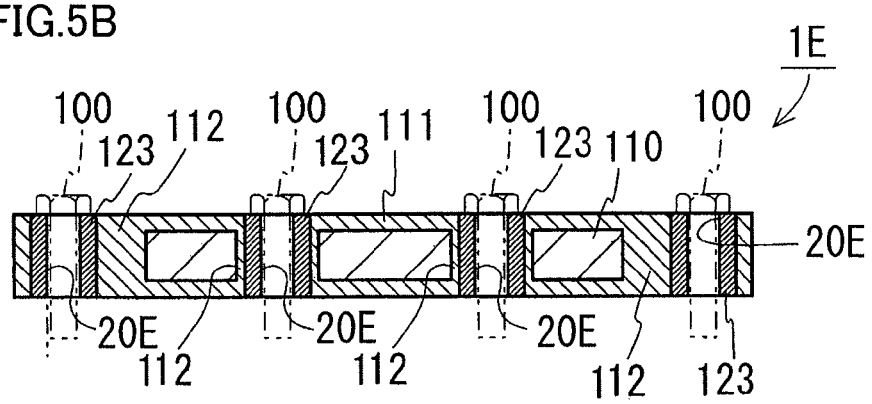
FIG. 5B is a schematic cross-sectional view along the line VB-VB in FIG. 5A.

As shown in FIG. 5B, in composite member 1E, an embedded member 123 made of stainless steel is present over the entire length of metal region 112 in a direction of thickness, an outer circumferential surface of embedded member 123 is covered with metal region 112, and opposing end surfaces of embedded member 123 are exposed at respective surfaces of metal region 112. A hole (receiving portion hole) serving as through hole 20E is provided in this embedded member 123, and when bolt 100 is fastened, the head portion of bolt 100 is in contact with one end surface of embedded member 123, which is exposed through metal region 112. Thus, in composite member 1E as well, a portion of through hole 20E with which the head portion of bolt 100 is in contact is composed of a metal (stainless steel here) other than a constituent metal for metal region 112 (magnesium here). In addition, entire through hole 20E including a portion with which the head portion of bolt 100 is in contact is composed of a single metal (stainless steel here).

Here, an area of the end surface of embedded member 123 has such a size that the end surface sufficiently projects from the periphery of the head portion as shown in FIG. 5B when bolt 100 is fastened and the head portion of bolt 100 is in contact with the end surface. In a case where an embedded member made of a high-hardness material such as stainless steel is made use of as in the present example, however, by increasing a thickness to some extent (for example, not smaller than 1 mm), the embedded member can support substantially the entire fastening force of bolt 100. In particular in a case where the embedded member is present over the entire metal region 112 in a direction of thickness as in the case of embedded member 123, even when the area is smaller than an area of bolt 100 in a plan view, the embedded member can sufficiently receive fastening force of bolt 100. Therefore, an area of the end surface of embedded member 123 does not have to have a size allowing sufficient projection thereof from the periphery of the head portion as described above. Further, an area of the end surface may be equal to or smaller than an area of the head portion of bolt 100 in a plan view or may be greater than the area in the plan view. This matter concerning an area of the end surface is similarly applicable also to an area of a metal plate 125b in Embodiment 7 which will be described later. Though embedded member 123 is a cylindrical body having a uniform cross-section over its entire length, it may be in such a form that a cross-sectional shape is partially different. For example, a tapered embedded member having a larger cross-section in a region on an end surface side, with which the head portion of bolt 100 is in contact, may be applicable.

Composite member 1E can also be manufactured similarly to composite member 1D in Embodiment 4 described above. Namely, embedded member 123 and the SiC aggregate are accommodated in a cast, the SiC aggregate is fixed to the cast with the use of a spacer described above, a composite of the SiC aggregate and the matrix metal melt is made as described above to form substrate 110, the melt flows into the gap formed by the spacer, and metal coating layer 111 is formed. In addition, as the melt flows into the recess portion in the SiC aggregate, metal region 112 is formed and simultaneously enveloped casting of embedded member 123 (here, a metal body including embedded member 123) is carried out so that embedded member 123 is integrated with substrate 110 and metal coating layer 111.

A circular end surface of embedded member 123 is exposed at a part of metal region 112 of obtained composite member 1E (190 mm long×140 mm wide×5 mm thick). Through hole 20E is formed in this embedded member 123 by machining (drilling here). Here, four through holes 20E on each longer edge side of composite member 1E, that is, a total of 8 through holes 20E, are provided.

In composite member 1E constructed as above, a part of through hole 20E, in particular, a portion with which the head portion of bolt 100 is in contact, is composed of a metal of high strength and high toughness other than the matrix metal, and therefore embedded member 123 can sufficiently receive fastening force of bolt 100. In particular, in composite member 1E, as entire through hole 20E is composed of a metal other than the matrix metal, embedded member 123 can receive substantially 100% of axial force of bolt 100. Therefore, it is expected that composite member 1E is further less likely to experience loosening of a state of fixing even though it is subjected to a heat cycle. In addition, since the end surface of embedded member 123 is exposed at the front and the back of composite member 1E as well, such effects as (1) easily maintaining a state of intimate contact with a fixing target in spite of occurrence of creep strain or the like in the matrix metal as a result of a heat cycle, owing to presence of a metal different in type from the matrix metal also in a portion of contact with the fixing target, and (2) excellent in workability in attachment are obtained.

[Embodiment 6]

Figure 6A:
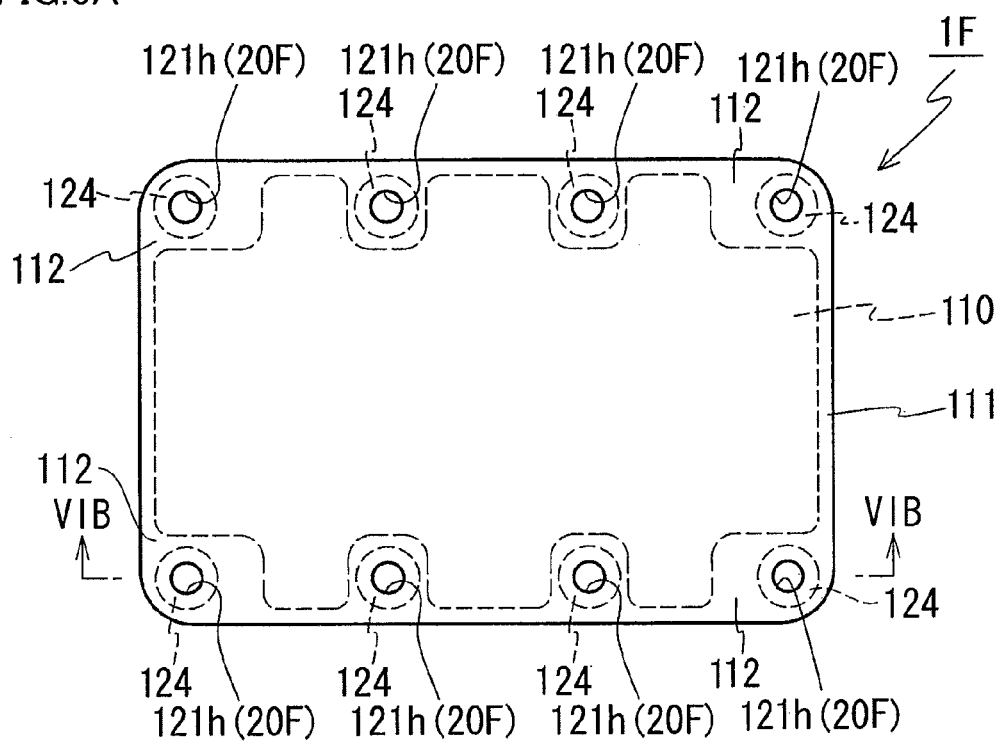
FIG. 6A is a plan view showing an overview of a composite member in Embodiment 6.

A magnesium-based composite member 1F in Embodiment 6 will be described with reference to FIGS. 6A and 6B. A basic construction of composite member 1F is the same as composite member 1E in Embodiment 5, and composite member 1F includes substrate 110 composed of a composite material which is a composite of magnesium and SiC and having an irregular shape, metal coating layer 111 composed of magnesium, and metal region 112 not containing SiC but composed of magnesium. In addition, composite member 1F also includes a through hole 20F through which bolt 100 is to be inserted in metal region 112. Composite member 1F in Embodiment 6 is different from composite member 1E in Embodiment 5 in a form of through hole 20F. Through hole 20F will mainly be described hereinafter, and detailed description of a feature the same as in Embodiment 5 will not be provided.

Figure 6B:
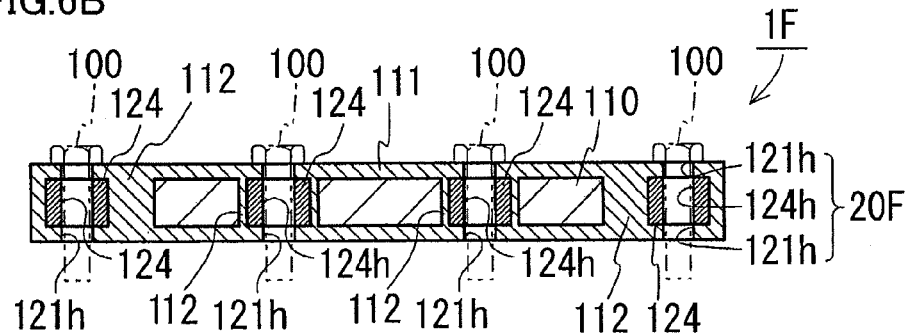
FIG. 6B is a schematic cross-sectional view along the line VIB-VIB in FIG. 6A.

As shown in FIG. 6B, in composite member 1F, an embedded member 124 made of stainless steel is present only in a part of metal region 112 in a direction of thickness, the entire outer surface of embedded member 124 is covered with a constituent metal for metal region 112, and embedded member 124 is not exposed at the surface of metal region 112. Therefore, the entire surface of composite member 1F is composed of magnesium.

Embedded member 124 is provided with an inner hole 124h (receiving portion hole), and embedded member 124 is a cylindrical body having a uniform cross-section over its entire length. A size (an area) of opposing end surfaces of embedded member 124 can be selected as appropriate. In a case of making use of an embedded member made of a high-hardness material such as stainless steel as described above, an area of the end surface may be equal to or smaller than an area of the head portion of bolt 100 in a plan view. If the area of the end surface is equal to or greater than the area in the plan view as in the present example, however, fastening force of bolt 100 is likely to be received, which is considered as preferable. In addition, both end surfaces of embedded member 124 are covered with a constituent metal for metal region 112 (magnesium here) as described above. A length of embedded member 124 can be selected as appropriate, in consideration of a thickness of composite member 1F, such that embedded member 124 is covered with metal region 112. Furthermore, similarly to embedded member 123 in Embodiment 5, embedded member 124 may be in such a form as partially different in cross-sectional shape. For example, a tapered body can achieve an increased area of joint with metal region 112 and an enhanced property of intimate contact with metal region 112.

In a portion of metal region 112 covering both end surfaces of embedded member 124, a base hole 121h (metal region hole) is provided to continue to inner hole 124h in embedded member 124. Therefore, through hole 20F is constituted of inner hole 124h and base hole 121h, and it is composed of a plurality of different types of metal materials similarly to through hole 20D in composite member 1D in Embodiment 4. In addition, in composite member 20F, as bolt 100 is fastened, the head portion of bolt 100 comes in contact with the surface of metal region 112.

Composite member 1F can be manufactured similarly to composite member 1D in Embodiment 4 described above. Namely, a plurality of metal bodies (for example, a stack obtained by sandwiching embedded member 124 between a pair of disk-shaped castings, followed by joint with welding or the like) obtained by joining embedded member 124 to a casting in an appropriate shape composed of magnesium are prepared such that embedded member 124 is arranged in an appropriate portion of metal region 112, this metal body and an SiC aggregate are accommodated in a cast, the SiC aggregate is fixed to the cast with the use of the spacer described above, a composite of the SiC aggregate and the matrix metal melt is made as described above to form substrate 110, the melt flows into a gap formed by the spacer, and metal coating layer 111 is formed. In addition, as the melt flows into a recess portion in the SiC aggregate, metal region 112 is formed and simultaneously enveloped casting of the metal body is carried out so that embedded member 124 is integrated with substrate 110 and metal coating layer 111.

Through hole 20F is formed in a portion of metal region 112 where embedded member 124 is present in obtained composite member 1F (190 mm long×140 mm wide×5 mm thick) by machining (drilling here). Here, four through holes 20F on each longer edge side of composite member 1F, that is, a total of 8 through holes 20F, are provided.

Composite member 1F constructed as above is expected to be less likely to experience loosening of a state of fixing even though it is subjected to a heat cycle, because a part of through hole 20F is composed of a metal of high strength and high toughness other than the matrix metal and fastening force of bolt 100 can be received by embedded member 124. In addition, since the entire surface of composite member 1F is composed of the matrix metal, such effects as (1) easily being subjected to electroplating, (2) excellent workability in surface polishing, cutting, or the like, and (3) good appearance are achieved.

<Variation>

Instead of embedded members 123, 124 in Embodiments 5, 6 described above or in combination with metal plate 122 in Embodiment 4 or embedded member 124 in Embodiment 6, metal fibers (for example, steel wool or the like) can be made use of as a constituent material for the embedded member. By making use of metal fibers in at least a part of the embedded member, the matrix metal melt impregnates in between the fibers and hence this embedded member and the metal region composed of the matrix metal are securely joined to each other.

In addition, a non-metal material such as a raw material (for example, carbon composite) containing carbon or carbon fibers can be made use of as a raw material for embedded member 124 in Embodiment 6. The non-metal inorganic material such as carbon is relatively low in toughness. Therefore, by forming a portion with which the head portion of bolt 100 is in contact with such a material, a portion formed of this material may fracture when bolt 100 is fastened. As described in Embodiment 6, however, in a case where a portion with which the head portion of bolt 100 is in contact is composed of the matrix metal, use of a brittle material as described above as a raw material for embedded member 124 can be expected.

[Embodiment 7]

Figure 7A:
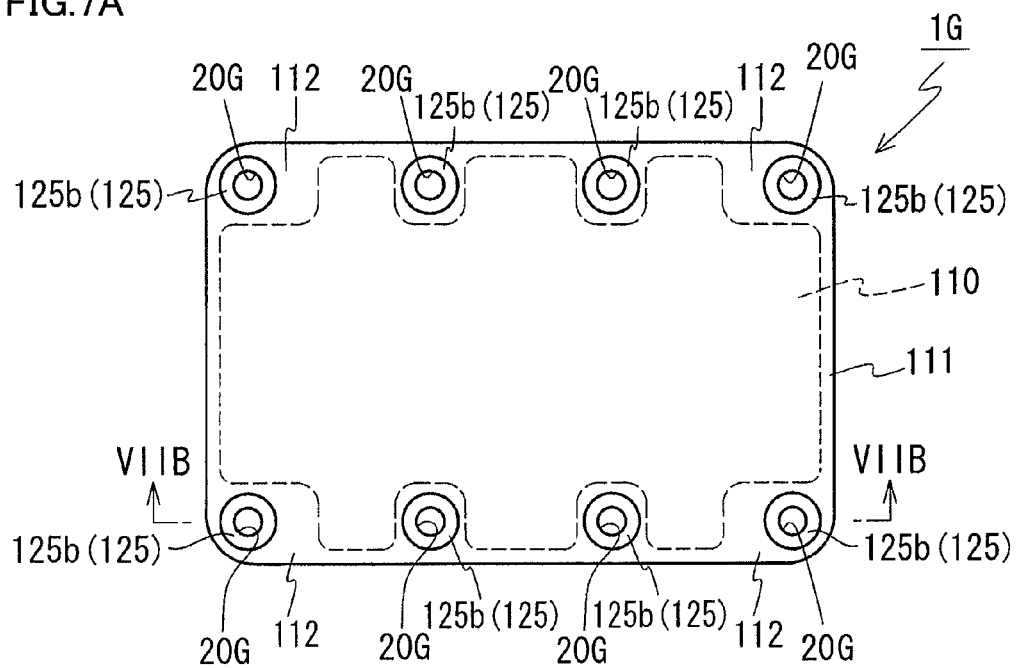
FIG. 7A is a plan view showing an overview of a composite member in Embodiment 7.
Figure 7B:
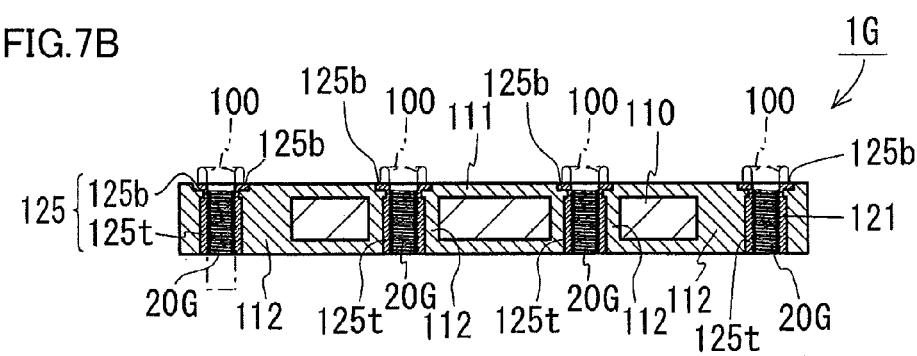
FIG. 7B is a schematic cross-sectional view along the line VIIB-VIIB in FIG. 7A.

A magnesium-based composite member 1G in Embodiment 7 will be described with reference to FIGS. 7A and 7B. A basic construction of composite member 1G is the same as composite member 1D in Embodiment 4, and composite member 1G includes substrate 110 composed of a composite material which is a composite of magnesium and SiC and having an irregular shape, metal coating layer 111 composed of magnesium, and metal region 112 not containing SiC but composed of magnesium. In addition, composite member 1G also includes a through hole 20G through which bolt 100 is to be inserted in metal region 112. Composite member 1G in Embodiment 7 is different from composite member 1D in Embodiment 4 in a form of through hole 20G. Through hole 20G will mainly be described hereinafter, and detailed description of a feature the same as in Embodiment 4 will not be provided.

In composite member 1G, through hole 20G continuing from the front to the back of composite member 1G is formed by an inner hole (receiving portion hole) in hardware 125 including metal plate 125b and a cylindrical portion 125t coupled to this metal plate 125b. One surface of metal plate 125 and an end surface of cylindrical portion 125t are exposed at opposing positions on the front and back surfaces of metal region 112, respectively, and a cylindrical outer circumferential surface of hardware 125 is covered with metal region 112. In composite member 1G as well, similarly to composite member 1D in Embodiment 4, a portion of through hole 20G with which the head portion of bolt 100 is in contact is composed of a metal (stainless steel here) other than a constituent metal for metal region 112 (magnesium here).

Hardware 125 is a commercially available clinching fastener made of stainless steel. Therefore, in composite member 1G, similarly to composite member 1E in Embodiment 5, the embedded member (hardware 125) is present over the entire length of the metal region in a direction of thickness and through hole 20G is composed of a single metal in its entirety. Therefore, similarly to composite member 1E in Embodiment 5, hardware 125 can sufficiently receive fastening force of the bolt. Therefore, an area of metal plate 125b shown in this example has a size allowing sufficient projection thereof from the periphery of the head portion in a state that bolt 100 is fastened and the head portion of bolt 100 is in contact with metal plate 125b, however, it does not have to have a size allowing projection as in Embodiment 5 described above. Further, unlike through holes 20D, 20E, 20F in Embodiments 4 to 6, of which inner circumferential surface is formed from a smooth surface, through hole 20G is a threaded screw hole. Though a fastener having a screw hole is made use of as a clinching fastener, a fastener having an inner circumferential surface of a hole formed from a smooth surface may be made use of.

Composite member 1G (190 mm long×140 mm wide×5 mm thick) is attached to a fixing target by screwing bolt 100 in through hole 20G and fastening this bolt 100.

Composite member 1G can also be manufactured similarly to composite member 1D in Embodiment 4 described above. It is noted that, in composite member 1G, through hole 20G is provided by forming base hole 121 and thereafter press-fitting hardware 125 in base hole 121. Here, four base holes 121 on each longer edge side of composite member 1G, that is, a total of 8 base holes 121, are provided, and hardware 125 is press-fitted in each of them. By press-fitting hardware 125, a constituent metal for metal region 112 enters a step portion between metal plate 125b and cylindrical portion 125t, so that hardware 125 is securely fixed to composite member 1G.

In composite member 1G constructed as above, a part of through hole 20G, in particular, a portion with which the head portion of bolt 100 is in contact, is composed of a metal of high strength and high toughness other than the matrix metal, and therefore composite member 1G can sufficiently receive fastening force of bolt 100 at metal plate 125b. In particular, in composite member 1G, as entire through hole 20G is composed of a metal other than the matrix metal, hardware 125 can receive substantially 100% of axial force of bolt 100. Therefore, composite member 1G is expected to be further less likely to experience loosening of a state of fixing even though it is subjected to a heat cycle. In addition, since composite member 1G has a screw hole as through hole 20G, through hole 20G can be coupled to bolt 100 by screwing and a property of intimate contact with the fixing target can be enhanced. Further, since hardware 125 is integrated with composite member 1G, it is not necessary to arrange a separate member for receiving axial force of bolt 100, and workability in fixing to a fixing target is excellent.

Embodiments 4 to 7 have been described above.

Contents common to Embodiments 8 to 10 will now be described hereinafter.

A magnesium-based composite member has a substrate composed of a composite material and a metal member (receiving portion). In order to obtain a composite material, for example, the following method is employed.

Source material powders mainly composed of SiC particles or a molded body thereof are/is arranged in advance in a cast. Then, a melt of a magnesium alloy or pure magnesium is poured in the cast. The SiC particles are thus infiltrated with this melt. Then, this melt is cooled and solidified. A composite material is thus obtained. By arranging a metal member in a mold together with the SiC particles before pouring the melt, a magnesium-based composite member having a substrate composed of a composite material and a metal member attached to this substrate can be obtained.

Since this method does not have a sintering step, each SiC particle is discretely present in the matrix metal. In other words, this composite material does not substantially have a network structure coupling SiC particles to one another in the sense of material mechanics.

In order to further lower a coefficient of thermal expansion of the composite material, increase in volume ratio of SiC particles in the composite material is effective. This volume ratio can readily be increased by high-density filling with SiC particles in advance, into which a dissolved matrix metal is in turn injected. This ratio can be more than 60 volume % and further more than 75 volume %. To this end, for example, powders of SiC particles should be introduced in a cast, followed by tapping. In addition, in a case where a volume ratio of SiC particles should further be increased, pressure forming, slip casting, or a doctor blade method can also be employed. With this method, a ratio of SiC occupied in a composite material can be more than 60 volume % and further more than 75 volume %.

It is noted that, in slip casting, for example, the following steps are performed.

Source material powders, water, and a dispersant are used to fabricate slurry. This slurry is molded and dried, and thus a powder molded body is formed. A general surfactant can be made use of as a dispersant.

In a doctor blade method, for example, the following steps are performed.

Source material powders, a solvent, an antifoaming agent, a resin, and the like are used to fabricate slurry. By pouring this slurry into a port of a doctor blade, a sheet-shaped structure is formed. Then, by evaporating the solvent, a powder molded body can be formed.

Each of Embodiments 8 to 10 will be described hereinafter with reference to the drawings.

[Embodiment 8]

Figure 8A:
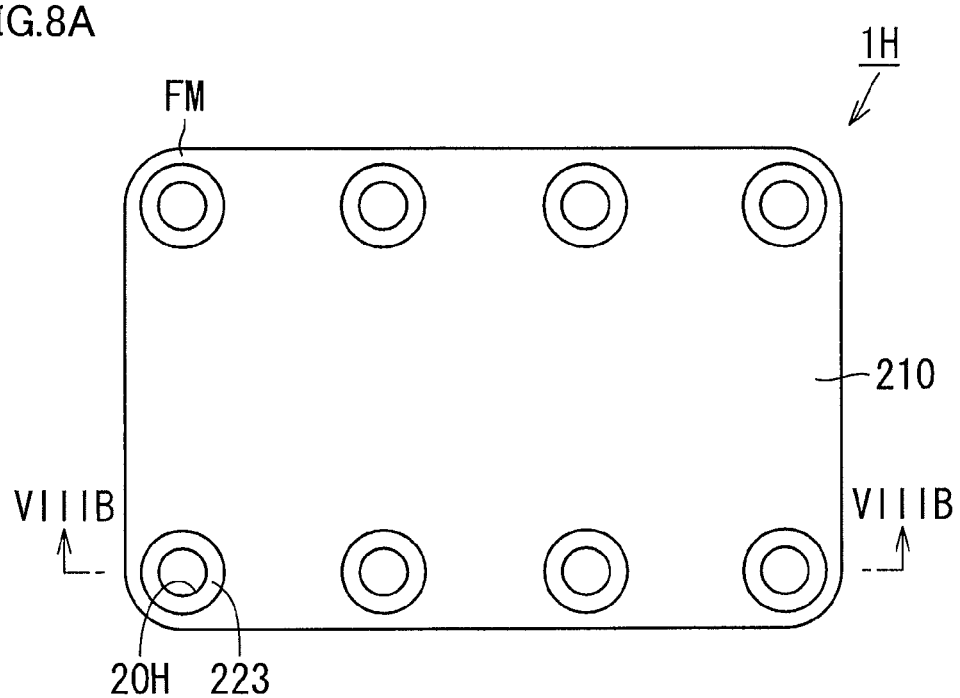
FIG. 8A is a plan view showing an overview of a composite member in Embodiment 8.
Figure 8B:
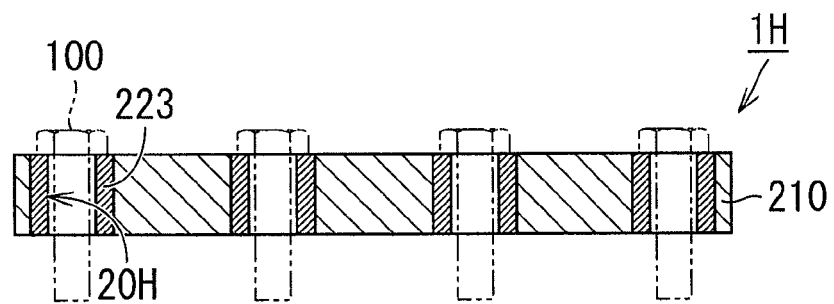
FIG. 8B is a schematic cross-sectional view along the line VIIIB-VIIIB in FIG. 8A.

Referring to FIGS. 8A and 8B, a magnesium-based composite member 1H in the present embodiment is provided with a through hole 20H through which bolt 100 (fastening member) for attachment to such a fixing target as a cooler is to be inserted. Magnesium-based composite member 1H has a substrate 210 and a metal member 223 (receiving portion).

Substrate 210 is composed of a composite material which is a composite of a matrix metal which is any of magnesium and a magnesium alloy and SiC as SiC particles dispersed in the matrix metal.

In addition, a penetrating portion is provided in substrate 210, The penetrating portion in substrate 210 in the present embodiment is a hole portion surrounding metal member 223 as shown in FIG. 8A. Since the entire circumference of metal member 223 is thus surrounded by substrate 210, metal member 223 is less likely to detach from substrate 210.

Metal member 223 is attached to the penetrating portion, that is, the hole portion, in substrate 210. Through hole 20H is provided in metal member 223. Metal member 223 is composed of a metal material different from the matrix metal.

As this metal material, specifically, a material similar to a material for metal plate 22 in Embodiment 1 (FIGS. 1A and 1B) can be employed.

According to the present embodiment, at the time of fastening of bolt 100, through hole 20H provided in metal member 223 rather than in substrate 210 receives fastening force. Therefore, a substrate fracture around the through hole that may occur in a case where the through hole provided in substrate 210 directly receives fastening force can be prevented. In addition, as SiC in substrate 210 is present as SiC particles dispersed in the matrix metal, individual particles can displace independently to some extent when external force is applied. Therefore, as compared with a case where a network portion bonding SiC to one another is formed, a substrate fracture is less likely. Moreover, as metal member 223 is composed of a metal material different from the matrix metal, a material for the receiving portion can be different from any of magnesium and the magnesium alloy, and hence a material with which lowering in axial force of bolt 100 is further less likely can be selected. Thus, even though magnesium-based composite member 1H is subjected to a heat cycle, loosening of a fixed state due to lowering in axial force of bolt 100 is less likely. Therefore, magnesium-based composite member 1H can securely be fixed to a fixing target and this fixed state can be maintained for a long period in a stable manner.

[Embodiment 9]

Figure 9A:
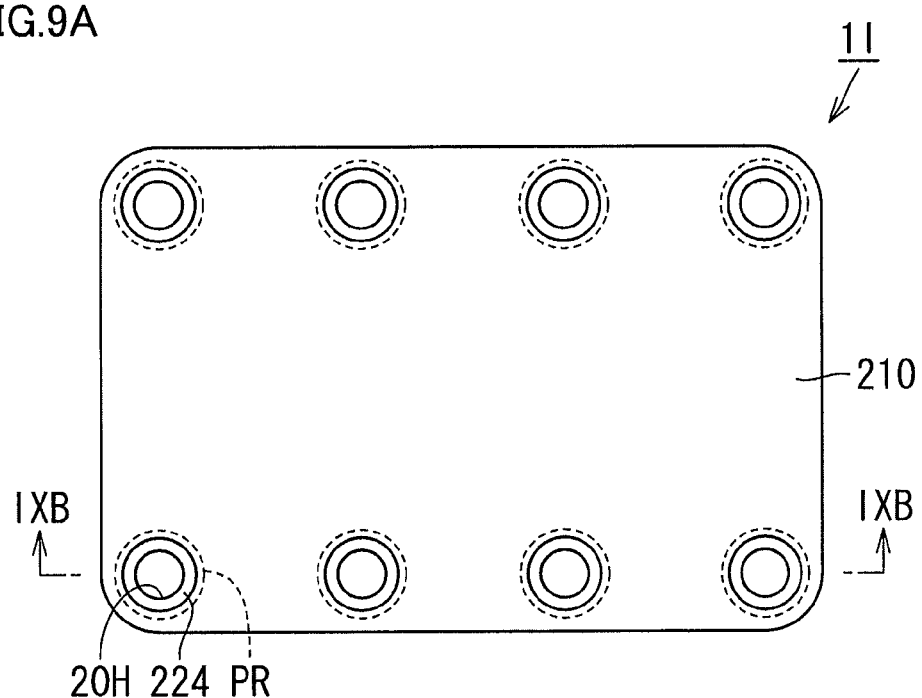
FIG. 9A is a plan view showing an overview of a composite member in Embodiment 9.
Figure 9B:
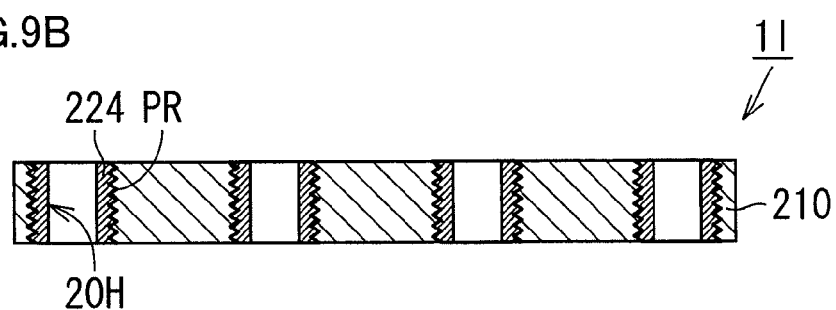
FIG. 9B is a schematic cross-sectional view along the line IXB-IXB in FIG. 9A.

Referring to FIGS. 9A and 9B, a metal member 224 in the present embodiment is different in shape from metal member 223 (FIGS. 8A and 8B) and has a protrusion PR buried in substrate 210. As this protrusion PR serves as an anchor, metal member 224 is less likely to detach from substrate 210.

Since the construction other than the above is substantially the same as the construction in Embodiment 8 described above, the same or corresponding elements have the same reference characters allotted and description thereof will not be repeated.

[Embodiment 10]

Figure 10:
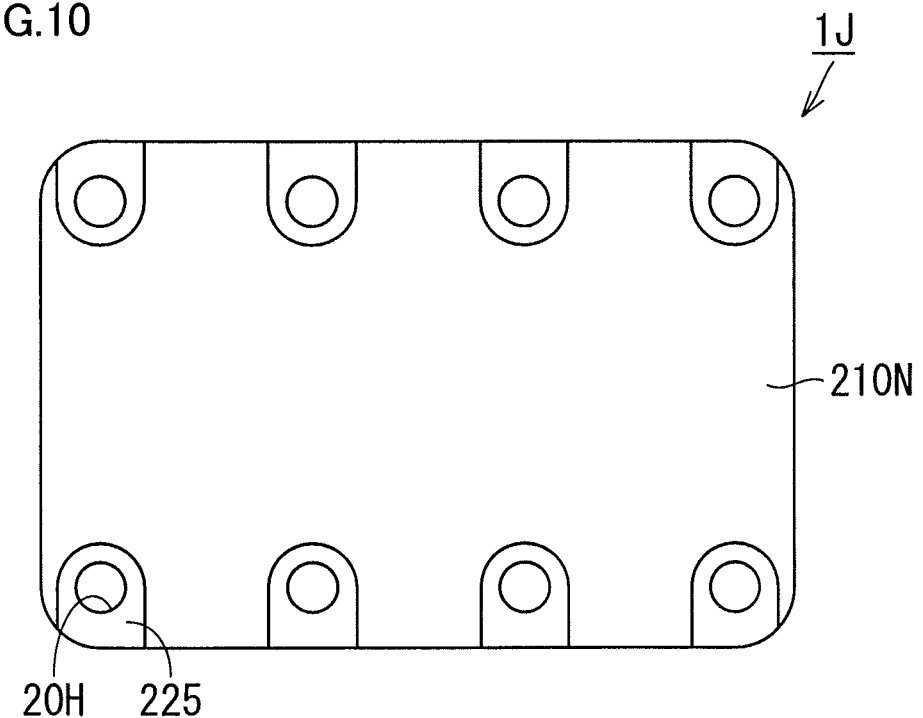
FIG. 10 is a plan view showing an overview of a composite member in Embodiment 10.

Referring to FIG. 10, a substrate 210N in the present embodiment is different from substrate 210 (FIG. 8A) in having a notch portion (a U-shaped portion in the drawing) as the penetrating portion, instead of a hole portion, In addition, a metal member 225 has a two-dimensional shape corresponding to this notch portion.

Since the construction other than the above is substantially the same as the construction in Embodiment 8 described above, the same or corresponding elements have the same reference characters allotted and description thereof will not be repeated.

If a through hole to which a metal member is to be attached is provided in a substrate, a portion FM (FIG. 8A) in the substrate which is located outward relative to the through hole is more likely to break. In contrast, according to the present embodiment, since metal member 225 is attached to the notch portion in substrate 210N, it is not necessary to provide a through hole for attachment of metal member 225 in substrate 210N. Therefore, breakage described above can be prevented.

Embodiments 8 to 10 have been described above.

[Embodiment 11]

Figure 11:
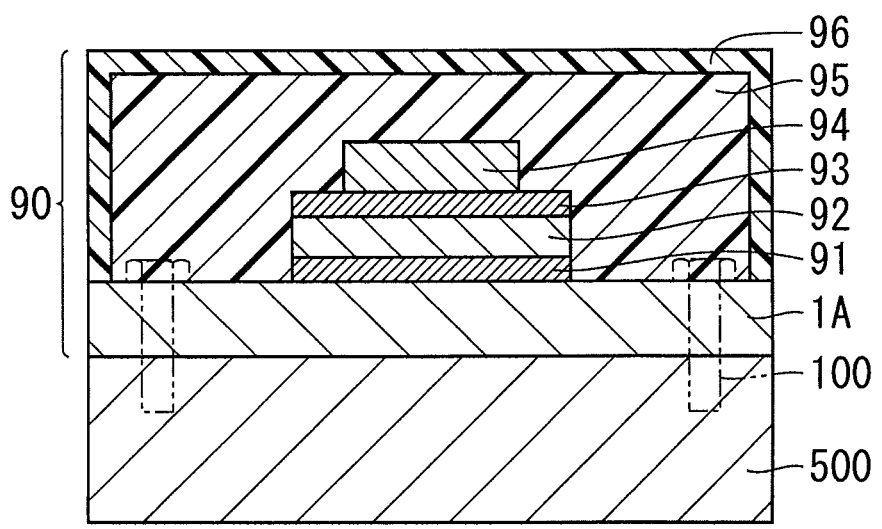
FIG. 11 is a cross-sectional view showing an overview of a heat radiation member and a semiconductor device in Embodiment 11.

A heat radiation member and a semiconductor device 90 in Embodiment 11 will be described with reference to FIG. 11. The heat radiation member in the present embodiment is formed from magnesium-based composite member 1A (heat radiation member). In addition, semiconductor device 90 in the present embodiment includes magnesium-based composite member 1A serving as the heat radiation member, a semiconductor chip 94 (semiconductor element), bolt 100, an insulating substrate 92, solder portions 91 and 93, a resin sealing portion 95, and a casing 96. Semiconductor device 90 is mounted on a cooler 500 by means of bolt 100. It is noted that any of magnesium-based composite members 1B to 1J (heat radiation members) may be employed as the heat radiation member instead of magnesium-based composite member 1A.

EXAMPLES

Test Example 1

The composite members in Embodiments 1 to 3 were each fixed to a fixing target with a bolt and axial force of fracture and axial force holding capability were measured. Table 1 shows results.

Figure 12A:
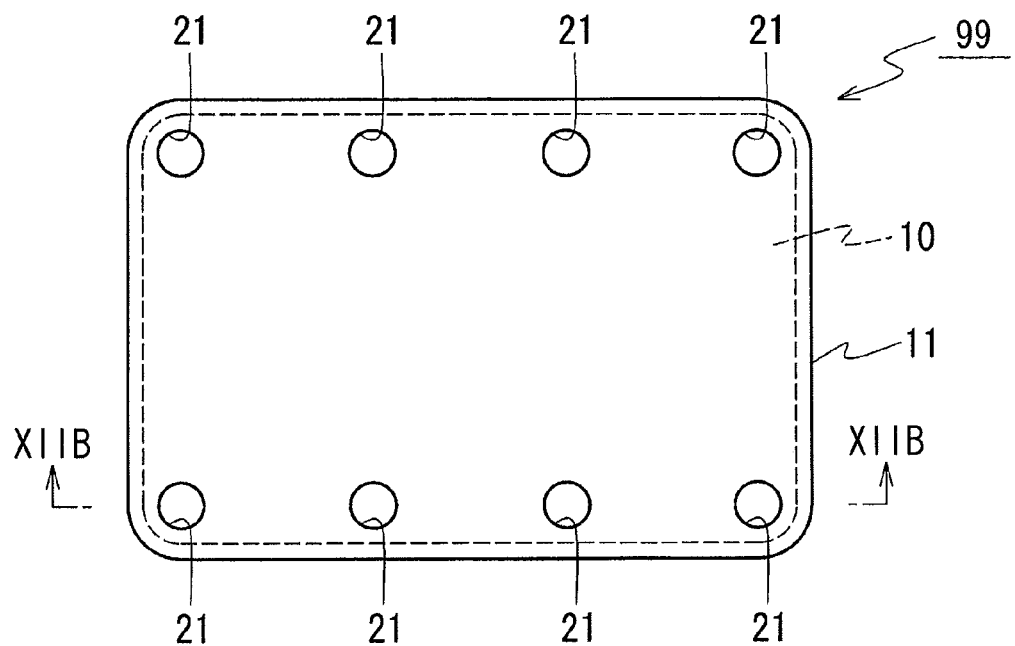
FIG. 12A is a plan view showing an overview of a composite member for comparison, used in Test Example 1.
Figure 12B:
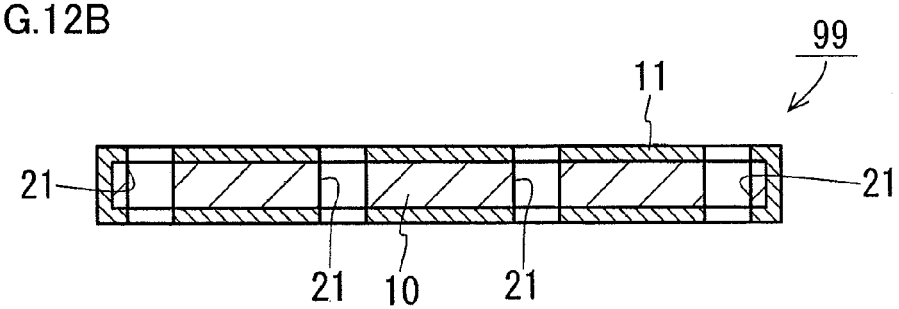
FIG. 12B is a schematic cross-sectional view along the line XIIB-XIIB in FIG. 12A.

In this test, an M6 bolt was employed and a through hole through which the bolt can be inserted was provided in each composite member. In addition, in this test, for comparison, a composite member 99 shown in FIGS. 12A and 12B was prepared (Reference Examples 1, 2). Composite member 99 has base hole 21 provided as in composite member 1A in Embodiment 1 as a through hole through which bolt 100 is to be inserted. In addition, in this test, with regard to Embodiment 1, the bolt was fixed with a plain washer made of stainless steel and having an outer diameter φ of 14 mm being interposed as metal plate 22, and with regard to Embodiments 2, 3 and Reference Example 2, the bolt was fixed with a plain washer made of stainless steel and having an outer diameter φ of 12 mm being interposed between the composite member and the bolt. In Reference Example 1, the bolt was directly fixed without interposing a plain washer between the composite member and the bolt. Further, in Embodiment 2, an area of metal plate 23 arranged on the surface of substrate 10 was set to 200 mm² (including an opening portion of through hole 23B), and in Embodiment 3, a clinching fastener having a screw hole corresponding to M6 was made use of.

Axial force at the time when the M6 bolt was fastened and a crack was caused in the composite member was measured as axial force of fracture. A commercially available measurement apparatus was made use of for measurement of axial force (measurement limit axial force: 16 kN). A crack was confirmed with visual inspection and X-ray CT.

An axial force holding ratio was measured as follows. Such a heat cycle that fastening at initial axial force of 7.5 kN was carried out with the use of the M6 bolt and fastening was held at 40° C.×1 h and then at 125° C.×1 h was repeated 10 times, and thereafter axial force was measured and initial axial force/axial force after the heat cycle was defined as the axial force holding ratio. It is noted that, in Reference Examples 1, 2, in order not to cause a crack, initial axial force was set to 2.0 kN and 4.0 kN, respectively.

TABLE 1

| | Evaluation | |
| --- | --- | --- |
| Embodiment | Axial Force of Fracture (kN) | Axial Force Holding Ratio (%) |
| Reference Example 1 | 2.9 | 79 |
| Reference Example 2 | 5.2 | 80 |
| 1 | 16 or greater | 80 |
| 2 | 13.6 | 82 |
| 3 | 16 or greater | 91 |

As shown in Table 1, it can be seen that Embodiments 1 to 3 have axial force of fracture as high as 7 kN or more and they can sufficiently withstand force applied by axial force of the bolt. In addition, it can be seen that Embodiments 1 to 3 have an axial force holding ratio as high as 75% or more even though they are subjected to a heat cycle, and axial force is less likely to relax. Moreover, it can be seen that Embodiments 1, 2 having a metal plate having an area at least 10% greater than the area of the head portion of the M6 bolt in a plan view and Embodiment 3 where the entire through hole is composed of a metal other than the matrix metal are further higher in axial force of fracture and axial force holding ratio than Reference Example 2 and that in particular Embodiment 3 has excellent characteristics. Therefore, the composite members in Embodiments 1 to 3 where at least a part of the through hole for bolt is composed of a material different from the matrix metal are expected to be able to maintain a state of secure fixing to a fixing target for a long period since initial fixing and a semiconductor device including the composite member is expected to have an excellent heat radiation property.

Test Example 2

The composite members in Embodiments 4 to 7 were each fixed to a fixing target with a bolt and axial force of fracture and axial force holding capability were measured. Table 2 shows results.

Figure 13A:
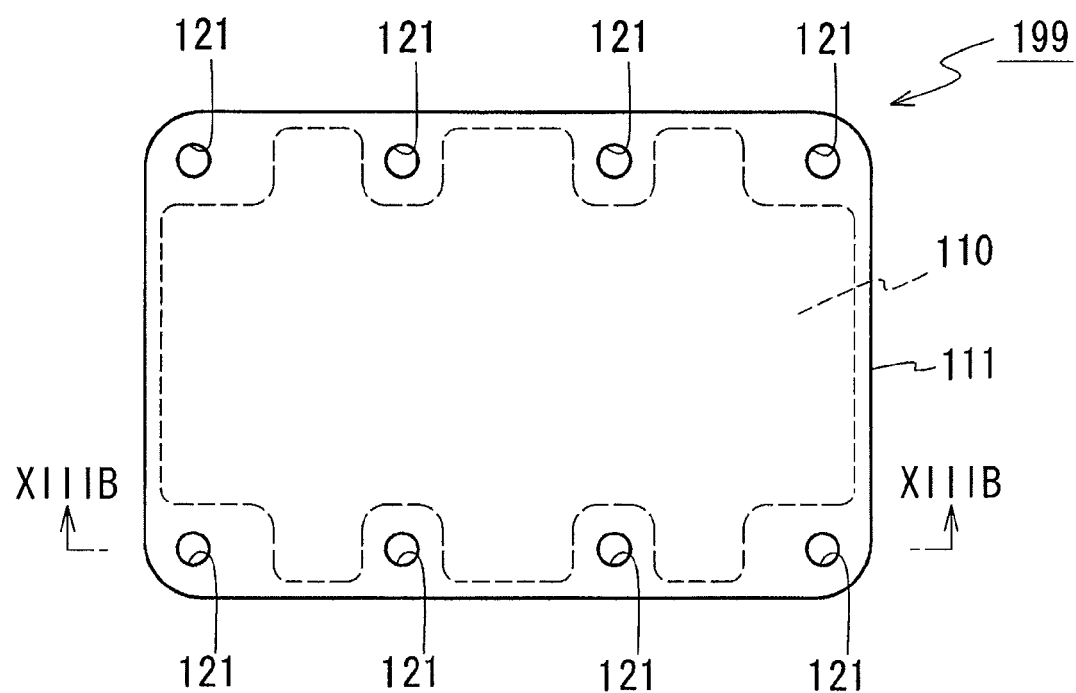
FIG. 13A is a plan view showing an overview of a composite member for comparison, used in Test Example 2.
Figure 13B:
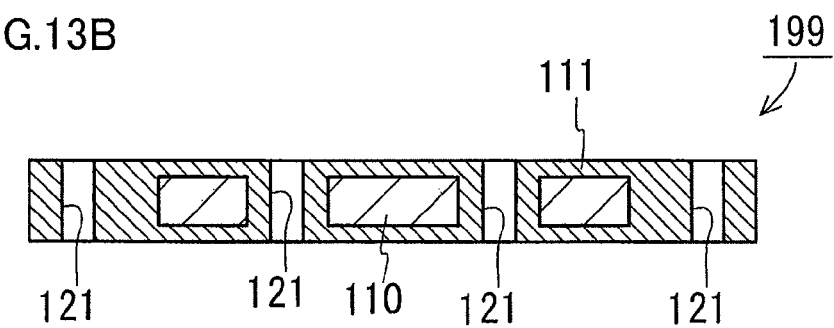
FIG. 13B is a schematic cross-sectional view along the line XIIIB-XIIIB in FIG. 13A.

In this test, an M6 bolt was employed and a through hole through which the bolt can be inserted was provided in each composite member. In addition, in this test, a form including metal fibers described in the variation (indicated as Embodiment 5/6 in Table 2; embedded member 123 in Embodiment 5 being composed of stainless steel wool) and a composite member 199 shown in FIGS. 13A and 13B for comparison were prepared. Composite member 199 has base hole 121 provided as in composite member 1D in Embodiment 4 as a through hole through which bolt 100 is to be inserted. In addition, in this test, with regard to Embodiments 4 to 7 and a comparative example, a bolt was fixed, with a plain washer made of stainless steel and having an outer diameter φ of 12 mm being interposed between the composite member and the bolt. Moreover, in Embodiment 4, an area of metal plate 122 (including an opening portion in plate hole 122h) was set to 200 mm², in Embodiments 5, 6, embedded members 123, 124 were each a cylindrical body having an outer shape of 13 mm and an inner diameter of 6.1 mm, in Embodiment 5/6, metal fibers were molded to obtain a cylindrical body having an outer shape of 13 mm and an inner diameter of 6.1 mm (a porosity of 30 volume %), and in Embodiment 7, a clinching fastener having a screw hole corresponding to M6 was made use of.

Axial force at the time when the M6 bolt was fastened and a crack was caused in the composite member was measured as axial force of fracture. A commercially available measurement apparatus was made use of for measurement of axial force (measurement limit axial force: 16 kN). A crack was confirmed with visual inspection and X-ray CT.

An axial force holding ratio was measured as follows. Such a heat cycle that fastening at initial axial force of 7.5 kN was carried out with the use of the M6 bolt and fastening was held at 40° C.×1 h and then at 125° C.×1 h was repeated 10 times, and thereafter axial force was measured and initial axial force/axial force after the heat cycle was defined as the axial force holding ratio.

TABLE 2

| Embodiment | Evaluation | |
|---|---|---|
| | Axial Force of fracture (kN) | Axial Force Holding Ratio (%) |
| Comparative Example | 16 or greater | 47 |
| 4 | 16 or greater | 76 |
| 5 | 16 or greater | 98 |
| 6 | 16 or greater | 79 |
| 5/6 | 16 or greater | 79 |
| 7 | 16 or greater | 97 |

As shown in Table 2, it can be seen that Embodiments and Comparative Example have each high axial force of fracture not lower than 7 kN and they can sufficiently withstand force applied by axial force of the bolt. Comparative Example, however, is low in axial force holding ratio when it is subjected to a heat cycle. In contrast, it can be seen that Embodiments each have a high axial force holding ratio not lower than 75% even though they are subjected to a heat cycle and fastening force is less likely to relax. In particular, it can be seen that Embodiments 5, 7 where the entire through hole is composed of a metal other than the matrix metal have further excellent characteristics. Therefore, the composite members in Embodiments where at least a part of the through hole for bolt is composed of a material different from a constituent metal for the metal region, that is, the matrix metal, are expected to be able to maintain a state of secure fixing to a fixing target for a long period and a semiconductor device including the composite member is expected to have an excellent heat radiation property.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims. For example, a content of SiC in a composite member, a form of presence of SiC (for example, a dispersed form), composition of a matrix metal (for example, a magnesium alloy), a size of a composite member, a thickness of a metal coating layer, a condition at the time of making of a composite, composition of a metal plate or hardware, a size of a through hole, the number of through holes, a position where a through hole is to be provided, composition of an embedded member, and the like can be varied as appropriate.

[Additional Description 1]

Embodiments described above encompass inventive concepts below.

(1) A magnesium-based composite member made of a composite of SiC and magnesium or a magnesium alloy is characterized in that a through hole through which a fastening member for attaching the composite member to a fixing target is to be inserted is provided, and a material for at least a part forming the through hole is different from SiC and magnesium or the magnesium alloy forming the composite member.

(2) The magnesium-based composite member described in (1) above is characterized in that the composite member has a network portion bonding SiC to one another, the through hole is in a region in the composite member where the network portion is present, and at least a portion of the through hole with which a head portion of the fastening member is in contact is composed of a metal other than magnesium and the magnesium alloy.

(3) The magnesium-based composite member described in (1) or (2) above is characterized by containing SiC by more than 70 volume %.

(4) The magnesium-based composite member described in any one of (1) to (3) above is characterized in that a metal plate composed of a metal other than magnesium and the magnesium alloy is provided at least in a portion of the through hole with which the head portion of the fastening member is in contact, and in such a state that the head portion is in contact with the metal plate as the fastening member is fastened, the metal plate has an area sufficient for projection from a periphery of the head portion.

(5) The magnesium-based composite member described in (4) above is characterized in that the composite member includes a substrate composed of a composite material which is a composite of SiC and magnesium or the magnesium alloy and a metal coating layer covering at least one surface of the substrate, a periphery of the metal plate is joined to the metal coating layer, and one surface of the metal plate is exposed through the metal coating layer.

(6) The magnesium-based composite member described in (4) or (5) above is characterized in that an inner circumferential surface of the through hole is also composed of a metal of the same type as the metal plate.

(7) The magnesium-based composite member described in any one of (4) to (6) above is characterized in that an area of the metal plate is at least 10% greater than the area of the head portion of the fastening member in a plan view.

(8) The magnesium-based composite member described in any one of (1) to (7) above is characterized in having a coefficient of thermal expansion not lower than 4 ppm/K and not higher than 8 ppm/K and thermal conductivity not lower than 180 W/m·K.

(9) A heat radiation member characterized by being formed from the magnesium-based composite member described in any one of (1) to (8) above.

(10) A semiconductor device characterized by including the heat radiation member described in (9) above and a semiconductor element mounted on this heat radiation member.

[Additional Description 2]

Embodiments described above encompass inventive concepts below.

(1) A magnesium-based composite member made of a composite of SiC and magnesium or a magnesium alloy is characterized in that a metal region not containing SiC but composed of magnesium or the magnesium alloy is provided, a through hole through which a fastening member for attaching the composite member to a fixing target is to be inserted is provided in the metal region, and a material for at least a part forming the through hole is different from a constituent metal for the metal region.

(2) The magnesium-based composite member described in (1) above is characterized in that an embedded member composed of a material different from the constituent metal for the metal region is provided in at least a part of the metal region in a direction of thickness, and at least a part of the through hole is provided in the embedded member.

(3) The magnesium-based composite member described in (1) or (2) above is characterized in that at least a portion of the through hole with which a head portion of the fastening member is in contact is composed of a metal different from the constituent metal for the metal region.

(4) The magnesium-based composite member described in (2) or (3) above is characterized in that the embedded member has a metal plate, and one surface of the metal plate is exposed at a surface of the metal region.

(5) The magnesium-based composite member described in any one of (2) to (4) above is characterized in that the embedded member is present over the entire length of the metal region in a direction of thickness.

(6) The magnesium-based composite member described in (2) above is characterized in that the embedded member is present only in a part of the metal region in a direction of thickness, and at least one opening portion of the through hole is composed of the constituent metal for the metal region.

(7) The magnesium-based composite member described in any one of (2) to (6) above is characterized in that at least a part of the embedded member includes metal fibers composed of a metal different from the constituent metal for the metal region.

(8) A heat radiation member characterized by being formed of the magnesium-based composite member described in any one of (1) to (7) above.

(9) A semiconductor device characterized by including the heat radiation member described in (8) above and a semiconductor element mounted on this heat radiation member.

INDUSTRIAL APPLICABILITY

The composite member according to the present invention can suitably be made use of for a heat spreader (heat radiation member) of a semiconductor element. The semiconductor device according to the present invention can suitably be made use of for a component of various electronic devices.

REFERENCE SIGNS LIST 1A to 1J composite member (magnesium-based composite member); 10, 110, 210, 210N substrate; 10h substrate hole; 11, 111 metal coating layer; 20A to 20H through hole; 21 base hole (substrate hole); 22, 23, 24b, 122 metal plate (receiving portion); 22h, 124h inner hole (receiving portion hole); 23h, 122h plate hole (receiving portion hole); 24 hardware; 24t, 125t cylindrical portion; 100 bolt; 112 metal region; 121 base hole (metal region hole); 123, 124 embedded member; 125 hardware (embedded member); 125b metal plate; 223 to 225 metal member (receiving portion); and PR protrusion.

The invention claimed is:

1. A magnesium-based composite member provided with a through hole through which a fastening member for attachment is to be inserted, comprising:

a substrate provided with a substrate hole through which said fastening member is to be inserted and composed of a composite material of SiC and a matrix metal which is any of magnesium and a magnesium alloy; and a receiving portion attached to said substrate and composed of a metal material different from said matrix metal, said receiving portion being provided with a receiving portion hole through which said fastening member is to be inserted, and at least a part of an inner circumferential surface of said through hole being formed from an inner circumferential surface of said receiving portion hole, and in said matrix metal, said SiC is present in a form of a porous body having open pores, the open pores of the porous body are filled with the matrix metal.

2. The magnesium-based composite member according to claim 1, wherein said composite material has a network portion for bonding SiC to one another, said substrate hole is provided in a region where said composite material has said network portion, and said receiving portion is arranged such that a head portion of said fastening member is in contact therewith.

3. The magnesium-based composite member according to claim 1, wherein said composite material contains said SiC by more than 70 volume %.

4. The magnesium-based composite member according to claim 1, wherein said receiving portion has a metal plate arranged such that a head portion of said fastening member is in contact therewith, and in such a state that said head portion is in contact with said metal plate as said fastening member is fastened, said metal plate extends to project from a periphery of said head portion in a plan view.

5. The magnesium-based composite member according to claim 4, further comprising a metal coating layer for covering at least one surface of said substrate, wherein a periphery of said metal plate is joined to said metal coating layer, and one surface of said metal plate is exposed at said metal coating layer.

6. The magnesium-based composite member according to claim 4, further comprising a cylindrical portion covering at least a part of an inner circumferential surface of said substrate hole and composed of a metal material identical in type to said metal material.

7. The magnesium-based composite member according to claim 4, wherein said metal plate has an area at least 10 percent greater than an area of the head portion of said fastening member in the plan view.

8. The magnesium-based composite member according to claim 1, having a coefficient of thermal expansion not lower than 4 ppm/K and not higher than 8 ppm/K and thermal conductivity not lower than 180 W/m·K.

9. A heat radiation member, formed from the magnesium-based composite member according to claim 1.

10. A semiconductor device, comprising:
    the heat radiation member according to claim 9; and
    a semiconductor element mounted on said heat radiation member.

11. The magnesium-based composite member according to claim 1,
    wherein in said matrix metal, said SiC is present in a form of being bonded by said network portion.

12. The magnesium-based composite member according to claim 11, wherein
    said substrate hole is provided in a region where said composite material has said network portion, and
    said receiving portion is arranged such that a head portion of said fastening member is in contact therewith.

* * * * *